(12) United States Patent
Cho

(10) Patent No.: US 11,152,045 B2
(45) Date of Patent: Oct. 19, 2021

(54) OUTPUT DRIVERS AND SEMICONDUCTOR MEMORY DEVICES HAVING THE SAME

(71) Applicant: Samsung Electronics Co., Ltd., Suwon-si (KR)

(72) Inventor: Hyunyoon Cho, Uiwang-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/884,887

(22) Filed: May 27, 2020

(65) Prior Publication Data
US 2021/0125648 A1 Apr. 29, 2021

(30) Foreign Application Priority Data

Oct. 28, 2019 (KR) .................. 10-2019-0134524

(51) Int. Cl.
| | |
|---|---|
| *G11C 8/10* | (2006.01) |
| *H03K 17/687* | (2006.01) |
| *G11C 8/18* | (2006.01) |
| *H03K 19/20* | (2006.01) |
| *H03K 19/0185* | (2006.01) |

(52) U.S. Cl.
CPC .............. *G11C 8/10* (2013.01); *G11C 8/18* (2013.01); *H03K 17/6871* (2013.01); *H03K 19/018507* (2013.01); *H03K 19/20* (2013.01)

(58) Field of Classification Search
None
See application file for complete search history.

(56) References Cited

U.S. PATENT DOCUMENTS

| | | |
|---|---|---|
| 6,348,834 B1 | 2/2002 | Brown |
| 6,498,511 B2 | 12/2002 | Tamura et al. |
| 7,030,657 B2 | 4/2006 | Stojanovic et al. |
| 7,348,794 B2 | 3/2008 | Tanaka |
| 7,440,343 B2 * | 10/2008 | Park ..................... G11C 7/1051 365/189.11 |
| 7,586,330 B2 | 9/2009 | Kim |
| 7,817,712 B2 | 10/2010 | Hidaka |
| 8,410,818 B1 * | 4/2013 | Hsu ................ H03K 19/018521 326/87 |
| 9,553,635 B1 | 1/2017 | Sejpal et al. |

(Continued)

FOREIGN PATENT DOCUMENTS

| | | |
|---|---|---|
| EP | 02378730 | 10/2011 |
| EP | 1863246 | 4/2018 |

*Primary Examiner* — Amy Cohen Johnson
*Assistant Examiner* — James H Cho
(74) *Attorney, Agent, or Firm* — Myers Bigel, P.A.

(57) ABSTRACT

An output driver includes a main output driver configured to receive data of an internal supply voltage to generate output data of an output supply voltage, and to receive the data of a ground voltage to generate the output data of the ground voltage, a pre-emphasis controller configured to detect a transition of the data from the ground voltage to the internal supply voltage to generate a first pulse signal, and to receive a pre-emphasis enable signal and the first pulse signal and generate a level-up pre-emphasis enable signal and a first level-up pulse signal of the ground voltage, a pre-emphasis pre-driver configured to generate one or more pre-emphasis pull-up control signals, and a pre-emphasis driver configured to pre-emphasize the output data based on the output data transitioning from the ground voltage to the output supply voltage.

20 Claims, 12 Drawing Sheets

(56) References Cited

U.S. PATENT DOCUMENTS

| | | | |
|---:|---|---|---|
| 9,647,666 B1* | 5/2017 | Oh | H03K 19/018521 |
| 10,003,336 B1* | 6/2018 | Wang | H03K 19/17744 |
| 2005/0258870 A1 | 11/2005 | Mitby et al. | |
| 2006/0188043 A1 | 8/2006 | Zerbe et al. | |
| 2009/0273375 A1 | 11/2009 | Luich | |
| 2011/0305271 A1 | 12/2011 | Zerbe et al. | |
| 2011/0310949 A1 | 12/2011 | Zerbe et al. | |
| 2012/0044984 A1 | 2/2012 | Zerbe et al. | |
| 2012/0207196 A1 | 8/2012 | Zerbe et al. | |
| 2013/0322506 A1 | 12/2013 | Zerbe et al. | |
| 2018/0006852 A1 | 1/2018 | Zerbe et al. | |
| 2018/0367350 A1 | 12/2018 | Zerbe et al. | |
| 2019/0199563 A1 | 6/2019 | Zerbe et al. | |
| 2020/0044645 A1* | 2/2020 | Son | H03K 17/164 |

* cited by examiner

OUTPUT DRIVERS AND SEMICONDUCTOR MEMORY DEVICES HAVING THE SAME

CROSS-REFERENCE TO THE RELATED APPLICATION

This application claims priority from Korean Patent Application No. 10-2019-0134524, filed on Oct. 28, 2019, in the Korean Intellectual Property Office, the contents of which is incorporated herein by reference in its entirety.

FIELD

Apparatuses and methods according to example embodiments of the inventive concepts relate to output drivers and semiconductor memory devices having the same.

BACKGROUND

In general, a data transmission/reception system includes a transmission device and a reception device, and the transmission device includes an output driver to transmit data to the reception device.

However, as the data transmission/reception system operates at a high speed, it may be beneficial to increase the driving capability of the output driver of the transmission device. One method of increasing the driving capability may include increasing the size of the output driver.

SUMMARY

The example embodiments of the inventive concepts are directed to output drivers that rapidly make a rising transition and a falling transition of output data, and semiconductor memory devices having such output drivers.

Example embodiments of the inventive concepts are not limited to the aforementioned object, and other unmentioned objects will be clearly understood by those skilled in the art based on the following detailed description of example embodiments of the inventive concepts.

An output driver according to an example embodiment of the inventive concepts may include: a main output driver configured to receive data of an internal supply voltage to generate output data of an output supply voltage lower than the internal supply voltage, and to receive the data of a ground voltage to generate the output data of the ground voltage; a pre-emphasis controller configured to detect a transition of the data from the ground voltage to the internal supply voltage to generate a first pulse signal that is activated for a predetermined time, and to receive a pre-emphasis enable signal and the first pulse signal and generate a level-up pre-emphasis enable signal and a first level-up pulse signal of the ground voltage; a pre-emphasis pre-driver configured to generate one or more pre-emphasis pull-up control signals of a high supply voltage higher than the internal supply voltage using the level-up pre-emphasis enable signal and the first level-up pulse signal of the ground voltage; and a pre-emphasis driver configured to pre-emphasize the output data in response to the one or more pre-emphasis pull-up control signals of the high supply voltage based on the output data transitioning from the ground voltage to the output supply voltage lower than the internal supply voltage.

An output driver according to an example embodiment of the inventive concepts may include: a pre-emphasis controller configured to detect a transition of data from a ground voltage to an internal supply voltage to generate a first pulse signal that is activated for a predetermined time, and to generate a first control signal and a second control signal using the first pulse signal; a first switching circuit configured to supply a high supply voltage higher than the internal supply voltage as a first supply voltage in response to the first control signal and supply the internal supply voltage as the first supply voltage in response to the second control signal; a pre-emphasis pre-driver or a main pre-driver configured to generate one or more pre-emphasis pull-up control signals of the first supply voltage using the first pulse signal and a pre-emphasis enable signal of the internal supply voltage or generate a predetermined number of main pull-up control signals of the first supply voltage using the first pulse signal, the pre-emphasis enable signal and a main pull-up control code of the internal supply voltage; and a pre-emphasis driver or a main driver configured to drive output data in response to the one or more pre-emphasis pull-up control signals or main pull-up control signals of the first supply voltage and pre-emphasize the output data when the output data transitions from the ground voltage to an output supply voltage lower than the internal supply voltage.

A semiconductor memory device according to an example embodiment of the inventive concepts may include: a command & address generator configured to receive a command & address, decode a command signal included in the command & address to generate a mode set command, an active command or a read command, and generate an address signal included in the command & address as a mode set code in response to the command signal included in the command & address being the mode set command, as a row address signal in response to the command signal being the active command, and as a column address signal in response to the command signal being the read command; a mode set register configured to receive the mode set code in response to the mode set command and set a main pull-up control code and a pre-emphasis enable signal; a row decoder configured to generate word line selection signals using the row address signal; a column decoder configured to generate column selection signals using the column address signal; a memory cell array configured to output data from memory cells selected from among a plurality of memory cells in response to the word line selection signals and the column selection signals; a read path unit configured to output the data output from the memory cell array; and a plurality of output drivers configured to drive the data output from the read path unit to output output data to a plurality of data terminals, wherein each of the output drivers comprises: a main output driver configured to generate the output data that transitions between an output supply voltage lower than an internal supply voltage and a ground voltage in response to the data and the main pull-up control code; a pre-emphasis controller configured to detect a transition of the data from the ground voltage to the internal supply voltage to generate a first pulse signal, and to receive the pre-emphasis enable signal and the first pulse signal and generate a level-up pre-emphasis enable signal and a first level-up pulse signal of the ground voltage; a pre-emphasis pre-driver configured to generate one or more pre-emphasis pull-up control signals of a high supply voltage higher than the internal supply voltage using the level-up pre-emphasis enable signal and first level-up pulse signal of the ground voltage; and a pre-emphasis driver configured to vary a transition time of the output data in response to the one or more pre-emphasis pull-up control signals of the high supply voltage based on the output data transitioning between the ground voltage to the output supply voltage lower than the internal supply voltage.

DETAILED DESCRIPTION

Hereinafter, output drivers and semiconductor memory devices having the same according to example embodiments of the inventive concepts will be described with reference to the accompanying drawings.

Figure 1:
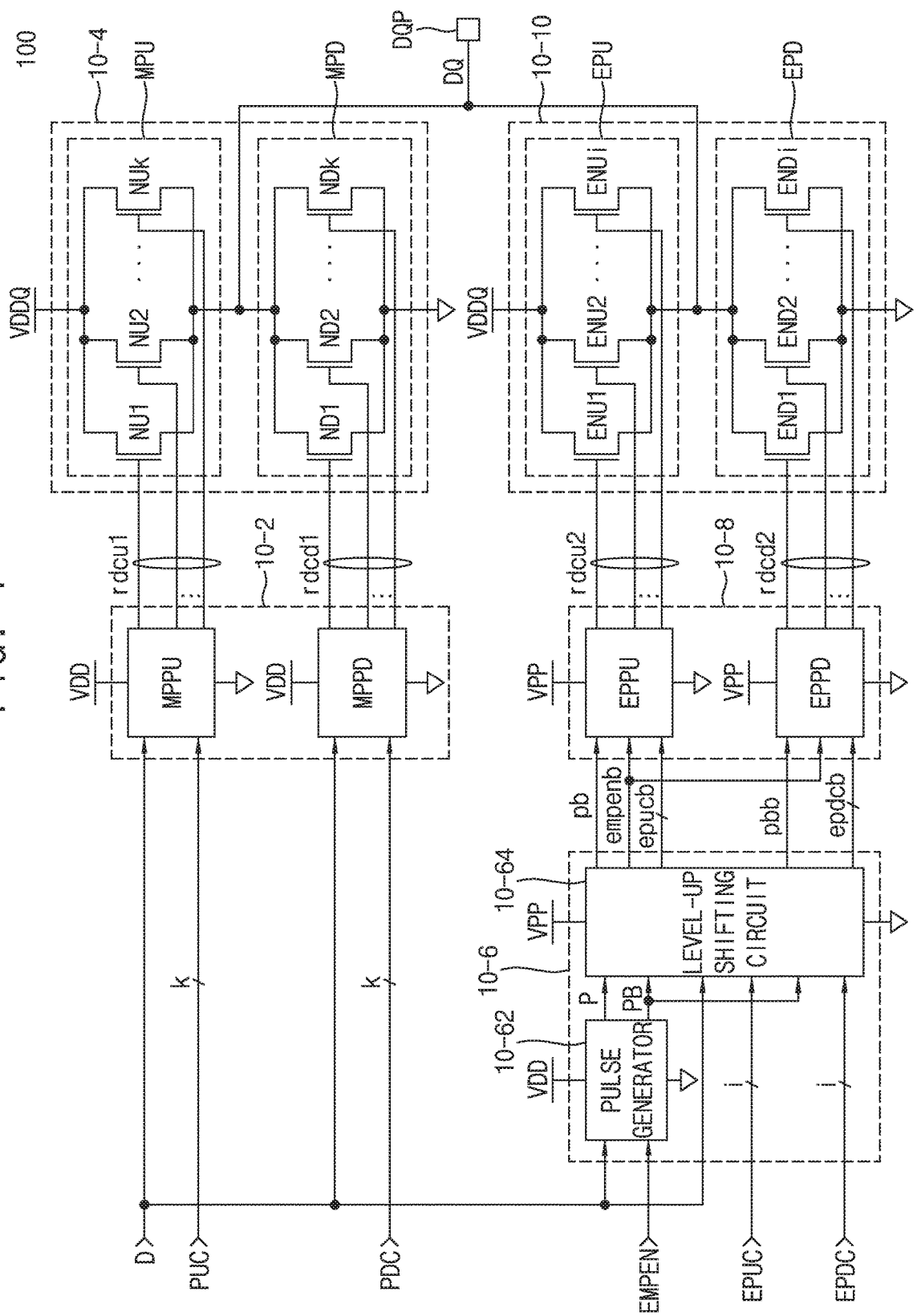
FIG. 1 is a schematic diagram showing a configuration of an output driver according to example embodiments of the inventive concepts.

FIG. 1 is a schematic diagram showing a configuration of an output driver 100 according to example embodiments of the inventive concepts. As shown in FIG. 1, the output driver 100 may include a main pre-driver 10-2, a main driver 10-4, a pre-emphasis controller 10-6, a pre-emphasis pre-driver 10-8, and a pre-emphasis driver 10-10. The main pre-driver 10-2 and the main driver 10-4 may constitute a main output driver, and the pre-emphasis pre-driver 10-8 and the pre-emphasis driver 10-10 may constitute a pre-emphasis output driver. The main pre-driver 10-2 may include a main pull-up pre-driver MPPU and a main pull-down pre-driver MPPD, and the main driver 10-4 may include a main pull-up driver MPU and a main pull-down driver MPD. The pre-emphasis controller 10-6 may include a pulse generator 10-62 and a level-up shifting circuit 10-64, the pre-emphasis pre-driver 10-8 may include a pre-emphasis pull-up pre-driver EPPU and a pre-emphasis pull-down pre-driver EPPD, and the pre-emphasis driver 10-10 may include a pre-emphasis pull-up driver EPU and a pre-emphasis pull-down driver EPD. Each of the main pull-up pre-driver MPPU, main pull-down pre-driver MPPD, and pulse generator 10-62 may be connected between an internal supply voltage VDD and a ground voltage. The main pull-up driver MPU may include k NMOS pull-up transistors NU1 to NUk connected in parallel between an output supply voltage VDDQ and a data terminal DQP, and the main pull-down driver MPD may include k NMOS pull-down transistors ND1 to NDk connected in parallel between the data terminal DQP and the ground voltage. The pre-emphasis pull-up driver EPU may include i NMOS pull-up transistors ENU1 to ENUi connected in parallel between the output supply voltage VDDQ and the data terminal DQP, and the pre-emphasis pull-down driver EPD may include i NMOS pull-down transistors END1 to ENDi connected in parallel between the data terminal DQP and the ground voltage. Here, the internal supply voltage VDD may be higher than the output supply voltage VDDQ. Each of the level-up shifting circuit 10-64, pre-emphasis pull-up pre-driver EPPU, and pre-emphasis pull-down pre-driver EPPD may be connected between a high supply voltage VPP and the ground voltage. Here, the high supply voltage VPP may be higher than the internal supply voltage VDD.

A description will hereinafter be given of the function of each of the blocks shown in FIG. 1.

The main pull-up pre-driver MPPU may generate k main pull-up control signals rdcu1 in response to data D and a k-bit main pull-up control code PUC.

The main pull-up driver MPU may be adjusted in driving capability in response to the k main pull-up control signals rdcu1. Each of the k NMOS pull-up transistors NU1 to NUk may be turned on when a corresponding one of the k main pull-up control signals rdcu1 is "high" in level and off when the same is "low" in level. As the number of turned-on ones of the k NMOS pull-up transistors NU1 to NUk increases, the main pull-up driver MPU may be reduced in resistance and thus increased in driving capability. The k NMOS pull-up transistors NU1 to NUk may be the same or different in size. In this disclosure, the "high" level may correspond to a logical value of 1 (e.g., a logic high level) and the "low" level may correspond to a logical value of 0 (e.g., a logic low level), but the present inventive concepts are not limited thereto.

The main pull-down pre-driver MPPD may generate k main pull-down control signals rdcd1 in response to the data D and a k-bit main pull-down control code PDC.

The main pull-down driver MPD may be adjusted in driving capability in response to the k main pull-down control signals rdcd1. Each of the k NMOS pull-down transistors ND1 to NDk may be turned on when a corresponding one of the k main pull-down control signals rdcd1 is "high" in level and off when the same is "low" in level. As the number of turned-on ones of the k NMOS pull-down transistors ND1 to NDk increases, the main pull-down driver MPD may be reduced in resistance and thus increased in driving capability. The k NMOS pull-down transistors ND1 to NDk may be the same or different in size.

The pulse generator 10-62 may be enabled in response to a pre-emphasis enable signal EMPEN to detect a rising transition (i.e., a transition from a "low" level (ground voltage) to a "high" level (e.g., internal supply voltage VDD)) of the data D so as to generate a first pulse signal P that is activated for a predetermined time, and to detect a falling transition (i.e., a transition from the "high" level (e.g., internal supply voltage VDD) to the "low" level (e.g., ground voltage)) of the data D so as to generate a second pulse signal PB that is activated for the predetermined time. The first pulse signal P may be activated upon the rising transition of the data D and deactivated after being delayed by the predetermined time. The second pulse signal PB may be activated upon the falling transition of the data D and deactivated after being delayed by the predetermined time. The predetermined time may be a period smaller than a "high" level period or a "low" level period of the data D. Each of the first and second pulse signals P and PB may have the internal supply voltage VDD level for the activation period. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts The level-up shifting circuit 10-64 may up (e.g., raise) the levels of the first pulse signal P, the second pulse signal PB, the pre-emphasis enable signal EMPEN, an i-bit pre-emphasis pull-up control code EPUC, and an i-bit pre-emphasis pull-down control code EPDC, each having the internal supply voltage VDD level, to generate a first level-up pulse signal pb, a second level-up pulse signal pbb, a level-up pre-emphasis enable signal empenb, an i-bit level-up pre-emphasis pull-up control code epucb, and an i-bit level-up pre-emphasis pull-down control code epdcb, each having the high supply voltage VPP level.

The pre-emphasis pull-up pre-driver EPPU may generate i pre-emphasis pull-up control signals rdcu2 in response to the level-up pre-emphasis enable signal empenb, the first level-up pulse signal pb, and the i-bit level-up pre-emphasis pull-up control code epucb. The "high" level of each of the i pre-emphasis pull-up control signals rdcu2 may be the high supply voltage VPP level, and the "low" level thereof may be the ground voltage level.

The pre-emphasis pull-up driver EPU may be adjusted in driving capability in response to the i pre-emphasis pull-up control signals rdcu2. Each of the i NMOS pull-up transistors ENU1 to ENUi may be turned on when a corresponding one of the i pre-emphasis pull-up control signals rdcu2 has the "high" level (i.e., the high supply voltage VPP level) and off when the same has the "low" level. As the number of turned-on ones of the i NMOS pull-up transistors ENU1 to ENUi increases, the pre-emphasis pull-up driver EPU may be reduced in resistance and thus increased in driving capability. The i NMOS pull-up transistors ENU1 to ENUi may be the same or different in size. In some embodiments, i may be smaller than k. In addition, because the high supply voltage VPP level is applied to the i NMOS pull-up transistors ENU1 to ENUi, the pre-emphasis pull-up driver EPU may be further reduced in resistance and thus further increased in driving capability. As a result, the pre-emphasis pull-up driver EPU performs a pre-emphasis operation for the activation period of the first pulse signal P, thereby rapidly making a rising transition of output data DQ.

The pre-emphasis pull-down pre-driver EPPD may generate i pre-emphasis pull-down control signals rdcd2 in response to the level-up pre-emphasis enable signal empenb, the second level-up pulse signal pbb, and the i-bit level-up pre-emphasis pull-down control code epdcb. The "high" level of each of the i pre-emphasis pull-down control signals rdcd2 may be the high supply voltage VPP level, and the "low" level thereof may be the ground voltage level.

The pre-emphasis pull-down driver EPD may be adjusted in driving capability in response to the i pre-emphasis pull-down control signals rdcd2. Each of the i NMOS pull-down transistors END1 to ENDi may be turned on when a corresponding one of the i pre-emphasis pull-down control signals rdcd2 has the "high" level and off when the same has the "low" level. As the number of turned-on ones of the i NMOS pull-down transistors END1 to ENDi increases, the pre-emphasis pull-down driver EPD may be reduced in resistance and thus increased in driving capability. The i NMOS pull-down transistors END1 to ENDi may be the same or different in size. In some embodiments, i may be smaller than k. In addition, because the high supply voltage VPP level is applied to the i NMOS pull-down transistors END1 to ENDi, the pre-emphasis pull-down driver EPD may be further reduced in resistance and thus further increased in driving capability. As a result, the pre-emphasis pull-down driver EPD performs the pre-emphasis operation for the activation period of the second pulse signal PB, thereby rapidly making a falling transition of the output data DQ.

Figure 2:
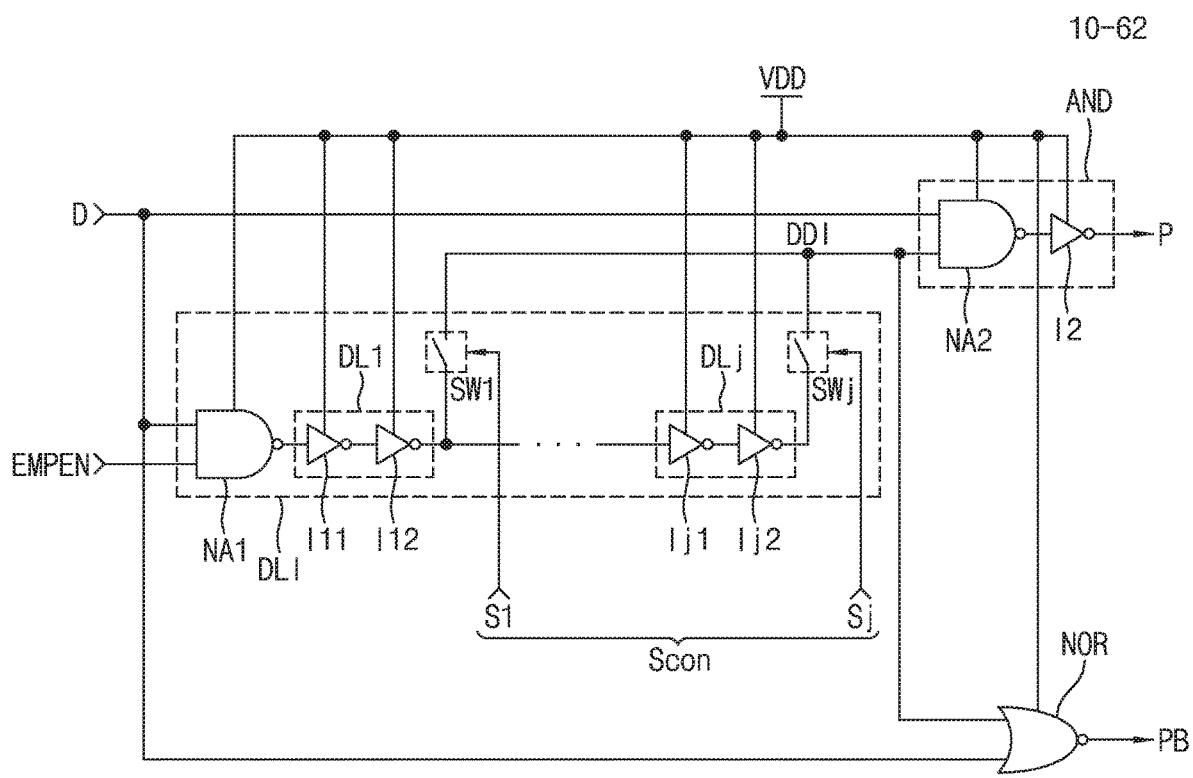
FIG. 2 is a schematic diagram showing a configuration of a pulse generator according to example embodiments of the inventive concepts.

FIG. 2 is a schematic diagram showing a configuration of a pulse generator 10-62 according to example embodiments of the inventive concepts. As shown in FIG. 2, the pulse generator 10-62 may include an inverted delay circuit DLI, an AND gate AND, and a NOR gate NOR. The inverted delay circuit DLI may include a first NAND gate NA1, j delay cells DL1 to DLj connected in series, and j switches SW1 to SWj. Each of the j delay cells DL1 to DLj may include two inverters (e.g., I11 and I12 to Ij1 and Ij2) connected in series. The AND gate AND may include a second NAND gate NA2 and an inverter I2.

A description will hereinafter be given of the function of each of the constituent elements shown in FIG. 2.

The inverted delay circuit DLI may operate in response to the pre-emphasis enable signal EMPEN to detect the rising transition of the data D, and delay and invert the data D by the predetermined time to generate inverted delay data DDI. The inverted delay circuit DLI may generate the inverted delay data DDI by varying the predetermined time in response to the pre-emphasis enable signal EMPEN and j selection signals Si to Sj (SCON). For example, the inverted delay data DDI may be generated from the delay cell DL1 when the switch SW1 is turned on in response to the selection signal Si and the inverted delay data DDI may be generated from the delay cell DLj when the switch SWj is turned on in response to the selection signal Sj.

The AND gate AND may perform a logical AND operation on the data D and the inverted delay data DDI to generate the first pulse signal P. The first pulse signal P may be a pulse signal that is activated when the data D transitions from a "low" level to a "high" level and deactivated after being delayed by the predetermined time. The predetermined time corresponding to the pulse width of the first pulse signal P may be smaller than an activation time 1UI (see FIG. 5) of one "high" level of the data D.

The NOR gate NOR may perform a logical NOR operation on the data D and the inverted delay data DDI to generate the second pulse signal PB. The second pulse signal PB may be a pulse signal that is activated when the data D transitions from a "high" level to a "low" level and deactivated after being delayed by the predetermined time.

Unlike FIG. 2, pulse generators for generating the first pulse signal P and the second pulse signal PB may be separately provided in some embodiments. In this case, it may be possible to make pulse widths of the first pulse signal P and second pulse signal PB different by making delay times of inverted delay circuits DLI different.

Figure 3:
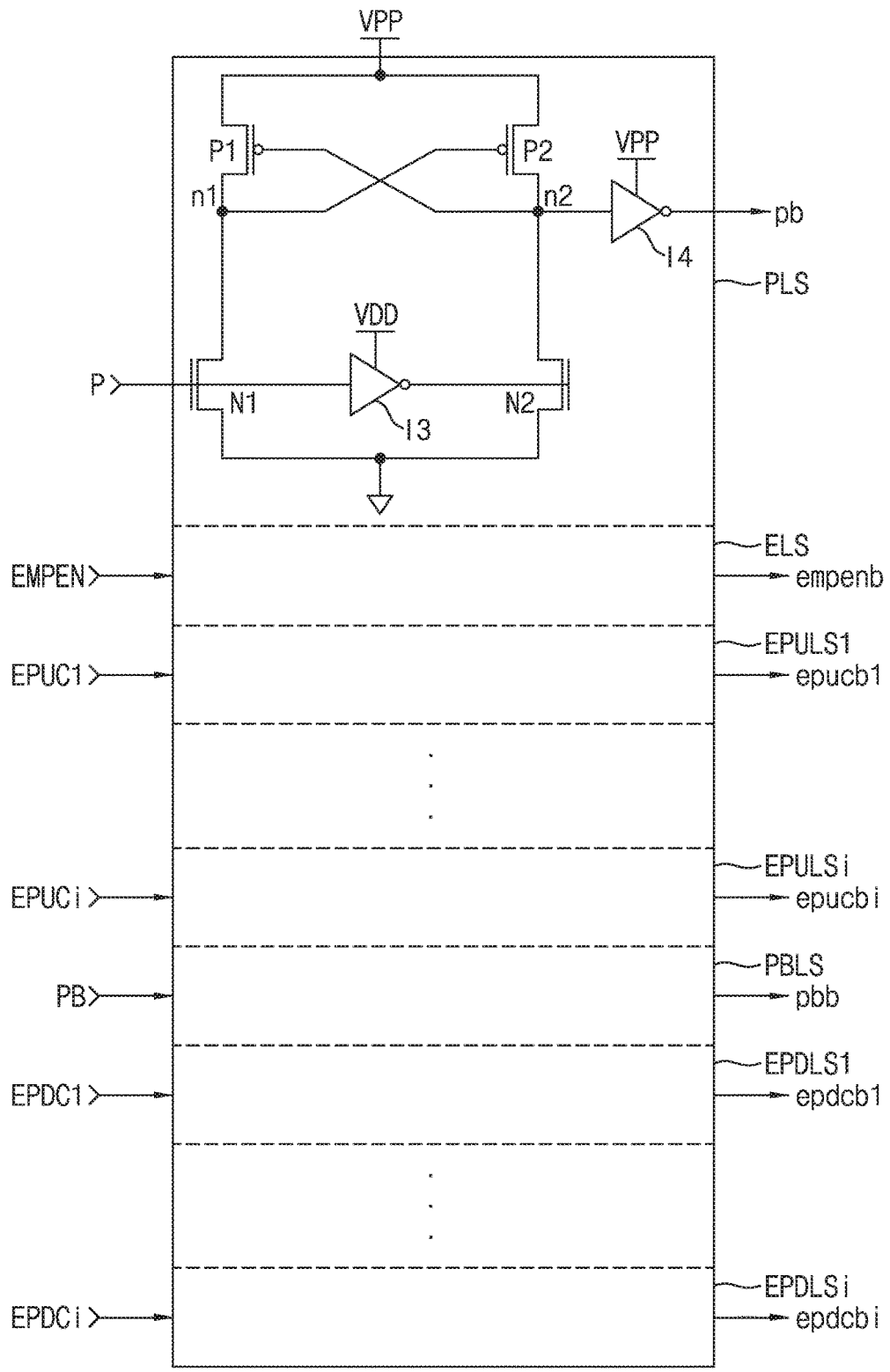
FIG. 3 is a schematic diagram showing a configuration of a level-up shifting circuit according to example embodiments of the inventive concepts.

FIG. 3 is a schematic diagram showing a configuration of a level-up shifting circuit 10-64 according to example embodiments of the inventive concepts. As shown in FIG. 3, the level-up shifting circuit 10-64 may include 2i+3 level-up shifters PLS, ELS, EPULS1 to EPULSi, PBLS, and EPDLS1 to EPDLSi. Each of the 2i+3 level-up shifters may include first and second PMOS transistors P1 and P2, first and second NMOS transistors N1 and N2, and inverters I3 and I4. For example, each of the 2i+3 level-up shifters may include the configuration illustrated in FIG. 3 for level-up shifter PLS.

The operation of the level-up shifter PLS shown in FIG. 3 will hereinafter be described.

When the first pulse signal P of a "high" level (e.g., internal supply voltage VDD) is applied, the first NMOS transistor N1 may be turned on, thereby causing a first node n1 to fall to the ground voltage level. At this time, the inverter I3 may invert the first pulse signal P of the "high" level to generate a signal of a "low" level, thereby causing the second NMOS transistor N2 to be turned off. The second PMOS transistor P2 may be turned on in response to the ground voltage level of the first node n1, so that a second node n2 may rise to a "high" level (e.g., high supply voltage VPP). At this time, the first PMOS transistor P1 may be turned off in response to the "high" level of the second node n2. The inverter I4 may invert a signal of the "high" level of the second node n2 to generate the first level-up pulse signal pb of the "low" level.

In contrast, when the first pulse signal P of the "low" level is applied, the first NMOS transistor N1 may be turned off. At this time, the inverter I3 may invert the first pulse signal P of the "low" level to generate a signal of the "high" level (e.g., internal supply voltage VDD), thereby causing the second NMOS transistor N2 to be turned on. As a result, the second node n2 may fall to the "low" level (e.g., ground voltage). The inverter I4 may invert a signal of the "low" level of the second node n2 to generate the first level-up pulse signal pb of the "high" level (e.g., high supply voltage VPP). At this time, the first PMOS transistor P1 may be turned on in response to the ground voltage level of the second node n2, so that the first node n1 may rise to the "high" level. As a result, the second PMOS transistor P2 may be turned off.

The level-up shifter PLS shown in FIG. 3 may generate the first level-up pulse signal pb of the "low" level (e.g., ground voltage) when the first pulse signal P of the "high" level (e.g., internal supply voltage VDD) is applied and may generate the first level-up pulse signal pb of the "high" level (e.g., high supply voltage VPP) when the first pulse signal P of the "low" level (e.g., ground voltage) is applied.

The other 2i+2 level-up shifters ELS, EPULS1 to EPULSi, PBLS, and EPDLS1 to EPDLSi shown in FIG. 3 may perform the same operation as that of the level-up shifter PLS to generate the level-up pre-emphasis enable signal empenb, the i-bit level-up pre-emphasis pull-up control code epucb1 to epucbi, the second level-up pulse signal pbb, and the i-bit level-up pre-emphasis pull-down control code epdcb1 to epdcbi of the "low" level (e.g., ground voltage), respectively, when the pre-emphasis enable signal EMPEN, the i-bit pre-emphasis pull-up control code EPUC1 to EPUCi, the second pulse signal PB, and the i-bit pre-emphasis pull-down control code EPDC1 to EPDCi of the "high" level (e.g., internal supply voltage VDD) are applied, respectively, and to generate the level-up pre-emphasis enable signal empenb, the i-bit level-up pre-emphasis pull-up control code epucb1 to epucbi, the second level-up pulse signal pbb, and the i-bit level-up pre-emphasis pull-down control code epdcb1 to epdcbi of the "high" level (e.g., high supply voltage VPP), respectively, when the pre-emphasis enable signal EMPEN, the i-bit pre-emphasis pull-up control code EPUC1 to EPUCi, the second pulse signal PB, and the i-bit pre-emphasis pull-down control code EPDC1 to EPDCi of the "low" level (e.g., ground voltage) are applied, respectively.

Figure 4:
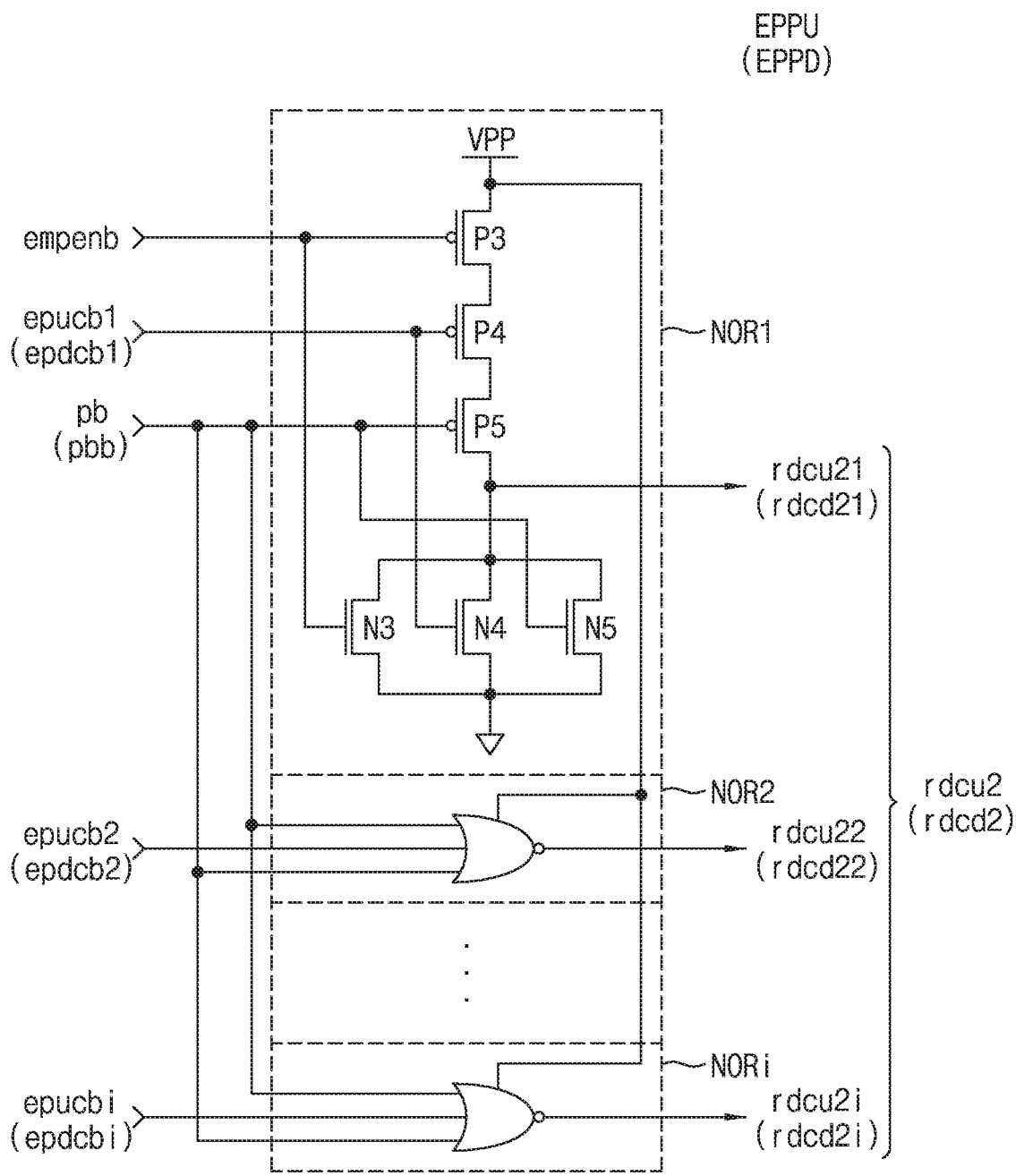
FIG. 4 is a schematic diagram showing configurations of a pre-emphasis pull-up pre-driver and a pre-emphasis pull-down pre-driver according to example embodiments of the inventive concepts.

FIG. 4 is a schematic diagram showing configurations of a pre-emphasis pull-up pre-driver EPPU and a pre-emphasis pull-down pre-driver EPPD according to example embodiments of the inventive concepts. As shown in FIG. 4, each of the pre-emphasis pull-up pre-driver EPPU and pre-emphasis pull-down pre-driver EPPD may include i NOR gates NOR1 to NORi. Each of the i NOR gates NOR1 to NORi may include third to fifth PMOS transistors P3 to P5 and third to fifth NMOS transistors N3 to N5. The configuration of the pre-emphasis pull-up pre-driver EPPU may differ from that of the pre-emphasis pull-down pre-driver EPPD in terms of the signals that are input and the signals that are output. Accordingly, differences in the inputs and/or outputs of the pre-emphasis pull-down pre-driver EPPD from the pre-emphasis pull-up pre-driver EPPU are illustrated in parentheses in FIG. 4.

The operation of the NOR gate NOR1 shown in FIG. 4 will hereinafter be described.

The third PMOS transistor P3 may be turned on in response to the level-up pre-emphasis enable signal empenb of the "low" level and the third NMOS transistor N3 may be turned off in response thereto, and the fourth PMOS transistor P4 may be turned on in response to the level-up pre-emphasis pull-up control code bit epucb1 (or level-up pre-emphasis pull-down control code bit epdcb1) of the "low" level and the fourth NMOS transistor N4 may be turned off in response thereto. When the first level-up pulse signal pb (or second level-up pulse signal pbb) of the "low" level is applied under the condition that the third PMOS transistor P3 and the fourth PMOS transistor P4 are turned on, the fifth PMOS transistor P5 may be turned on and the fifth NMOS transistor N5 may be turned off, thereby causing the pre-emphasis pull-up control signal rdcu21 (or pre-emphasis pull-down control signal rdcd21) of the "high" level (e.g., high supply voltage VPP) to be generated. That is, only when the level-up pre-emphasis enable signal empenb, the level-up pre-emphasis pull-up control code bit epucb1 (or level-up pre-emphasis pull-down control code bit epdcb1), and the first level-up pulse signal pb (or second level-up pulse signal pbb) are all "low" in level, the pre-emphasis pull-up control signal rdcu21 (or pre-emphasis pull-down control signal rdcd21) of the "high" level (e.g., high supply voltage VPP) may be generated. In contrast, when the first level-up pulse signal pb (or second level-up pulse signal pbb) of the "high" level (e.g., high supply voltage VPP) is applied under the condition that the third PMOS transistor P3 and the fourth PMOS transistor P4 are turned on, the pre-emphasis pull-up control signal rdcu21 (or pre-emphasis pull-down control signal rdcd21) of the "low" level (e.g., ground voltage) may be generated.

Each of the other NOR gates NOR2 to NORi may perform the same operation as that of the above NOR gate NOR1.

In the above embodiments, each of the pre-emphasis pull-up driver EPU and the pre-emphasis pull-down driver EPD may be configured with one NMOS pull-up transistor ENU1 and one NMOS pull-down transistor END1. In this case, the pre-emphasis pull-up control code EPUC, the pre-emphasis pull-down control code EPDC, the level-up pre-emphasis pull-up control code epucb, and the level-up pre-emphasis pull-down control code epdcb that are applied to the level-up shifting circuit 10-64, the pre-emphasis pull-up pre-driver EPPU, and the pre-emphasis pull-down pre-driver EPPD may be omitted and/or not used.

Figure 5:
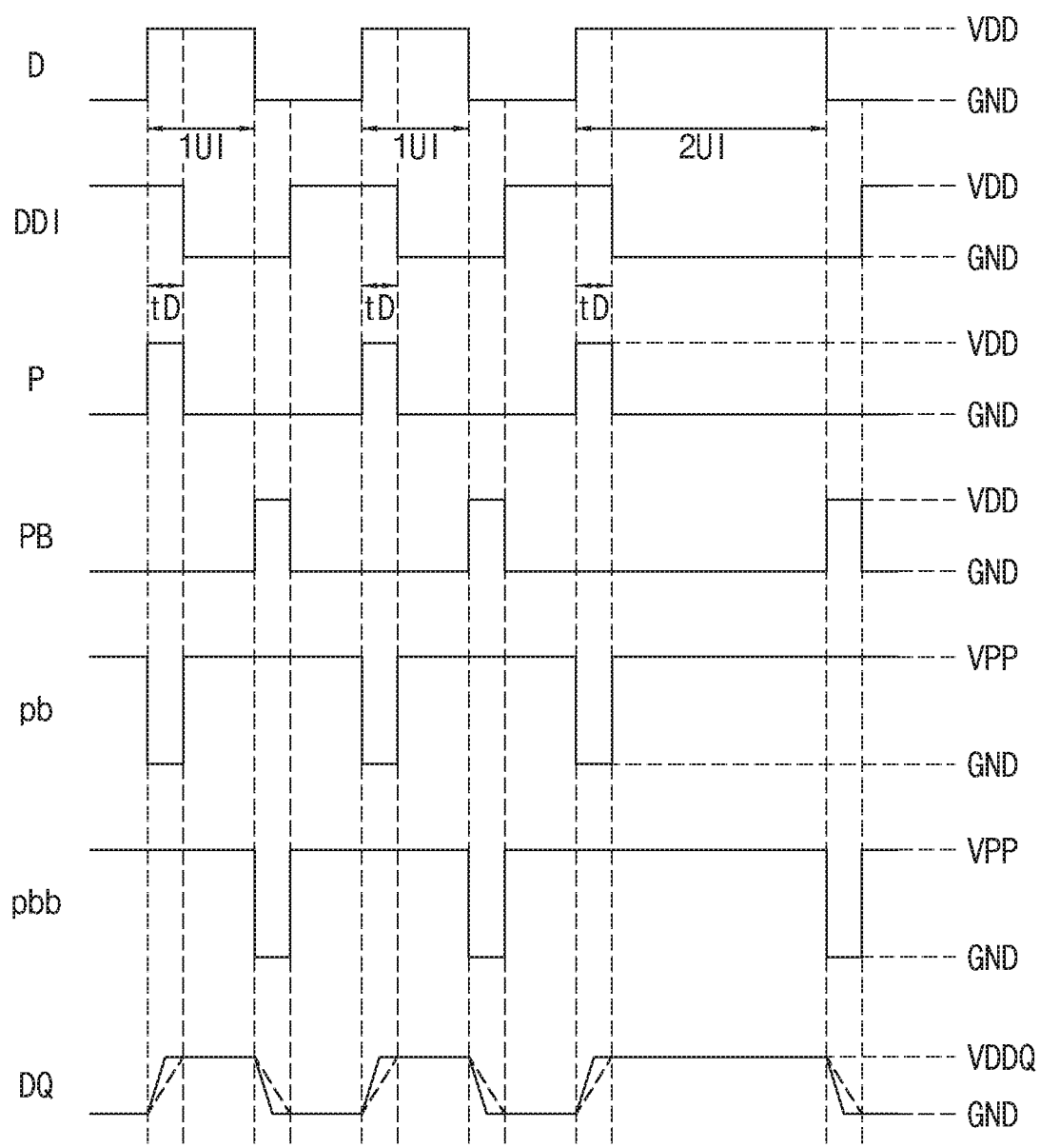
FIG. 5 is a timing diagram illustrating an operation of an output driver according to example embodiments of the inventive concepts.

FIG. 5 is a timing diagram illustrating an operation of an output driver according to example embodiments of the inventive concepts, more particularly, an operation based on the data D when the pre-emphasis enable signal EMPEN of a "high" level and the k-bit main pull-up control code PUC, i-bit pre-emphasis pull-up control code EPUC, k-bit main pull-down control code PDC, and i-bit pre-emphasis pull-down control code EPDC of "high" levels are applied.

Referring to FIGS. 1 to 5, when the data D transitions from a "low" level to a "high" level (e.g., internal supply voltage VDD), the pulse generator 10-62 may delay and invert the data D by a predetermined time tD to generate inverted delay data DDI. In some embodiments, the data D may remain at the "high" level for an activation time 1UI or 2UI. In addition, the pulse generator 10-62 may perform a logical AND operation on the data D and the inverted delay data DDI to generate the first pulse signal P of the "high" level (e.g., internal supply voltage VDD). The level-up shifting circuit 10-64 may receive the first pulse signal P of the "high" level (e.g., internal supply voltage VDD) and generate the first level-up pulse signal pb of the "low" level (e.g., ground voltage).

In contrast, when the data D transitions from the "high" level (e.g., internal supply voltage VDD) to the "low" level, the pulse generator 10-62 may perform a logical NOR operation on the data D and the inverted delay data DDI to generate the second pulse signal PB of the "high" level (e.g., internal supply voltage VDD). The level-up shifting circuit 10-64 may receive the second pulse signal PB of the "high" level (e.g., internal supply voltage VDD) and generate the second level-up pulse signal pbb of the "low" level (e.g., ground voltage).

Data DQ indicated by a solid line represents data in the case where the pre-emphasis enable signal EMPEN of the "high" level is applied and the pre-emphasis driver 10-10 is thus operated, and data DQ indicated by a dotted line represents data in the case where the pre-emphasis enable signal EMPEN of the "low" level is applied and the pre-emphasis driver 10-10 is thus not operated. As compared with the data DQ indicated by the dotted line, the data DQ indicated by the solid line may rapidly rise to the "high" level upon rising transition and may rapidly fall to the "low" level upon falling transition (e.g., the transition time has been decreased).

Figure 6:
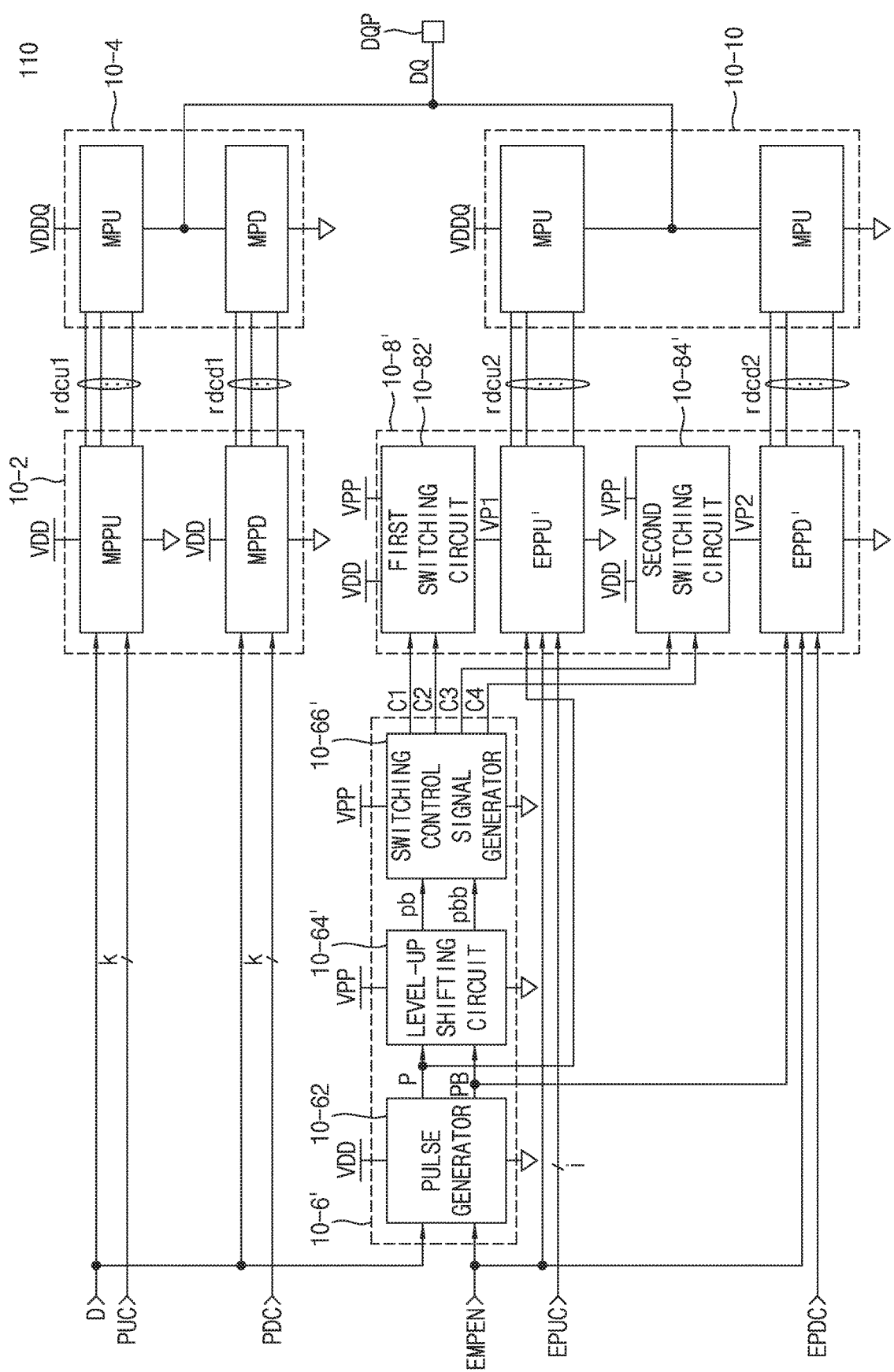
FIG. 6 is a schematic diagram showing a configuration of an output driver according to example embodiments of the inventive concepts.

FIG. 6 is a schematic diagram showing a configuration of an output driver 110 according to example embodiments of the inventive concepts. The output driver 110 shown in FIG. 6 may be the same or similar in configuration as the output driver 100 shown in FIG. 1, with the exception of a pre-emphasis controller 10-6' and a pre-emphasis pre-driver 10-8'. The pre-emphasis controller 10-6' may include the pulse generator 10-62 shown in FIG. 1, a level-up shifting circuit 10-64', and a switching control signal generator 10-66'. The pre-emphasis pre-driver 10-8' may include a first switching circuit 10-82', a pre-emphasis pull-up pre-driver EPPU', a second switching circuit 10-84', and a pre-emphasis pull-down pre-driver EPPD'.

The same blocks as those in FIG. 1, among the blocks in FIG. 6, perform the same functions and a description thereof will thus be omitted, and the function of each of the additional blocks will hereinafter be described.

The level-up shifting circuit 10-64' may up (e.g., raise) the levels of the first pulse signal P and the second pulse signal PB having the internal supply voltage VDD level to generate the first level-up pulse signal pb and the second level-up pulse signal pbb having the high supply voltage VPP level.

The switching control signal generator 10-66' may generate a first control signal C1 and a second control signal C2 in response to the first level-up pulse signal pb and may generate a third control signal C3 and a fourth control signal C4 in response to the second level-up pulse signal pbb. The first control signal C1, the second control signal C2, the third control signal C3, and the fourth control signal C4 may swing (e.g., transition) between the ground voltage and the high supply voltage VPP.

The first switching circuit 10-82' may supply, to the pre-emphasis pull-up pre-driver EPPU', the high supply voltage VPP as a first supply voltage VP1 in response to the first control signal C1, and the internal supply voltage VDD as the first supply voltage VP1 in response to the second control signal C2. Namely, the first switching circuit 10-82' may supply the high supply voltage VPP as the first supply voltage VP1 when the first pulse signal P is activated, and the internal supply voltage VDD as the first supply voltage VP1 when the first pulse signal P is deactivated.

The pre-emphasis pull-up pre-driver EPPU' may receive the first supply voltage VP1 and generate the i pre-emphasis pull-up control signals rdcu2 in response to the pre-emphasis enable signal EMPEN, the first pulse signal P, and the i-bit pre-emphasis pull-up control code EPUC.

The second switching circuit 10-84' may supply, to the pre-emphasis pull-down pre-driver EPPD', the high supply voltage VPP as a second supply voltage VP2 in response to the third control signal C3, and the internal supply voltage VDD as the second supply voltage VP2 in response to the fourth control signal C4. Namely, the second switching circuit 10-84' may supply the high supply voltage VPP as the second supply voltage VP2 when the second pulse signal PB is activated, and the internal supply voltage VDD as the second supply voltage VP2 when the second pulse signal PB is deactivated.

The pre-emphasis pull-down pre-driver EPPD' may receive the second supply voltage VP2 and generate the i pre-emphasis pull-down control signals rdcd2 in response to the pre-emphasis enable signal EMPEN, the second pulse signal PB, and the i-bit pre-emphasis pull-down control code EPDC.

Figure 7:
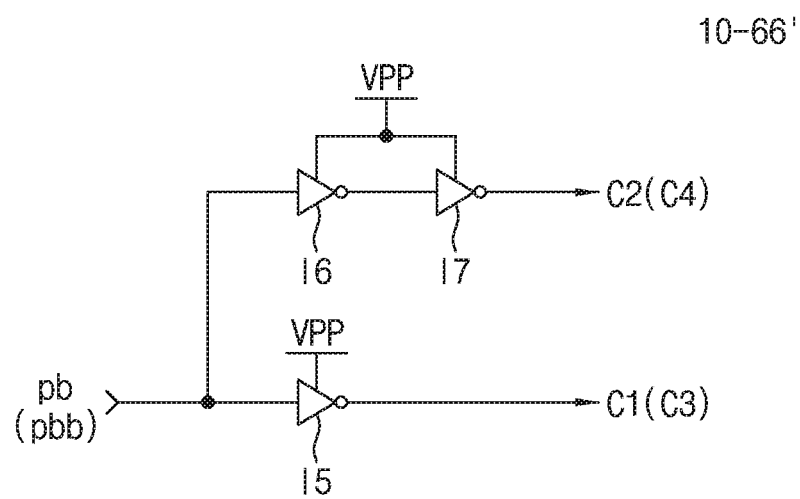
FIG. 7 is a schematic diagram showing a configuration of a switching control signal generator according to example embodiments of the inventive concepts.

FIG. 7 is a schematic diagram showing a configuration of a switching control signal generator 10-66' according to example embodiments of the inventive concepts. As shown in FIG. 7, the switching control signal generator 10-66' may include fifth to seventh inverters I5 to I7. In some embodiments, the switching control signal generator 10-66' may have a similar configuration to process the first level-up pulse signal pb and the second level-up pulse signal pbb, which may respectively generate different output signals. Accordingly, differences in the outputs of the switching control signal generator 10-66' based on whether the input is the first level-up pulse signal pb or the second level-up pulse signal pbb are illustrated in parentheses in FIG. 7.

In FIG. 7, the fifth inverter I5 may be supplied with the high supply voltage VPP, and may invert the first level-up pulse signal pb (or second level-up pulse signal pbb) to generate the first control signal C1 (or third control signal C3). That is, the fifth inverter I5 may invert the first level-up pulse signal pb (or second level-up pulse signal pbb) of the high supply voltage VPP to generate the first control signal C1 (or third control signal C3) of the ground voltage, and may invert the first level-up pulse signal pb (or second level-up pulse signal pbb) of the ground voltage to generate the first control signal C1 (or third control signal C3) of the high supply voltage VPP.

The sixth and seventh inverters I6 and I7 may be supplied with the high supply voltage VPP, and may receive the first level-up pulse signal pb (or second level-up pulse signal pbb) and generate the second control signal C2 (or fourth control signal C4). That is, the sixth and seventh inverters I6 and I7 may receive the first level-up pulse signal pb (or second level-up pulse signal pbb) of the high supply voltage VPP and generate the second control signal C2 (or fourth control signal C4) of the high supply voltage VPP, and may receive the first level-up pulse signal pb (or second level-up pulse signal pbb) of the ground voltage and generate the second control signal C2 (or fourth control signal C4) of the ground voltage.

Figure 8:
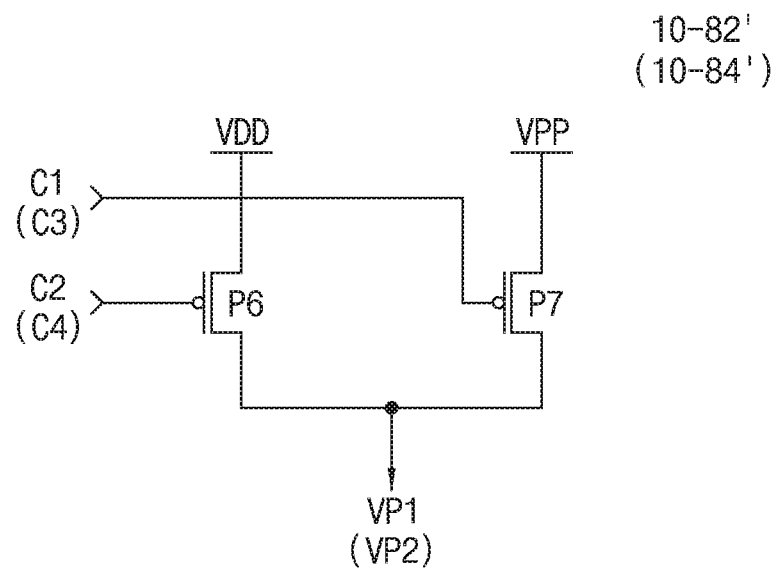
FIG. 8 is a schematic diagram showing configurations of a first switching circuit and a second switching circuit according to example embodiments of the inventive concepts.

FIG. 8 is a schematic diagram showing configurations of a first switching circuit 10-82' and a second switching circuit 10-84' according to example embodiments of the inventive concepts. As shown in FIG. 8, each of the first switching circuit 10-82' and second switching circuit 10-84' may include sixth and seventh PMOS transistors P6 and P7. The configuration of the first switching circuit 10-82' may differ from that of the second switching circuit 10-84' in terms of the signals that are input and the signals that are output. Accordingly, differences in the inputs and/or outputs of the second switching circuit 10-84' from the first switching circuit 10-82' are illustrated in parentheses in FIG. 8.

In FIG. 8, the sixth PMOS transistor P6 may be turned on in response to the second control signal C2 (or fourth control signal C4) of the ground voltage to supply the internal supply voltage VDD as the first supply voltage VP1 (or second supply voltage VP2), and may be turned off in response to the second control signal C2 (or fourth control signal C4) of the high supply voltage VPP.

The seventh PMOS transistor P7 may be turned on in response to the first control signal C1 (or third control signal C3) of the ground voltage to supply the high supply voltage VPP as the first supply voltage VP1 (or second supply voltage VP2), and may be turned off in response to the first control signal C1 (or third control signal C3) of the high supply voltage VPP.

Figure 9:
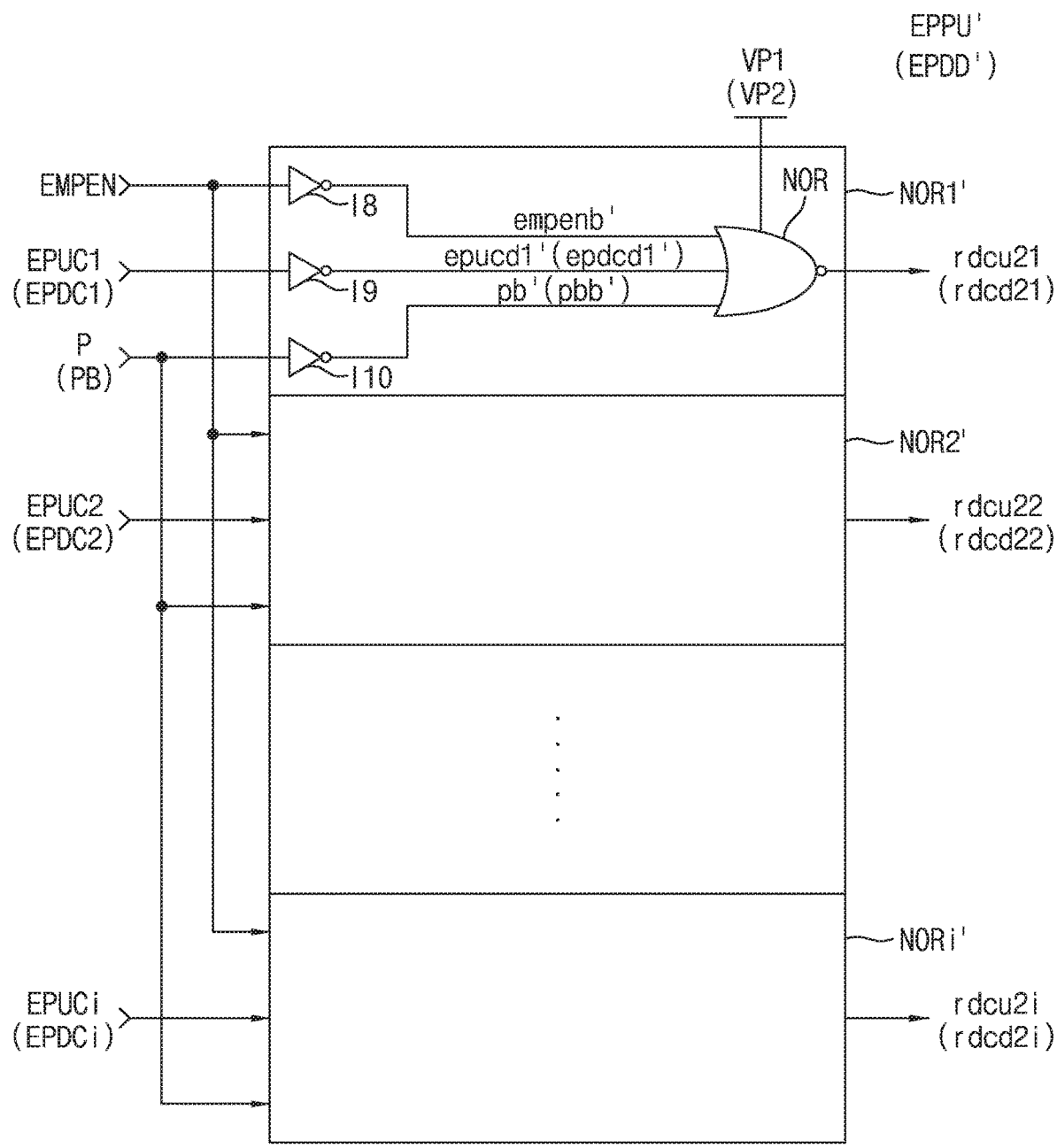
FIG. 9 is a schematic diagram showing configurations of a pre-emphasis pull-up pre-driver and a pre-emphasis pull-down pre-driver according to example embodiments of the inventive concepts.

FIG. 9 is a schematic diagram showing configurations of a pre-emphasis pull-up pre-driver EPPU' and a pre-emphasis pull-down pre-driver EPPD' according to example embodiments of the inventive concepts. As shown in FIG. 9, each of the pre-emphasis pull-up pre-driver EPPU' and pre-emphasis pull-down pre-driver EPPD' may include i inverted NOR gates NOR1' to NORi'. Each of the i inverted NOR gates NOR1' to NORi' may include inverters I8, I9, and I10 and a NOR gate NOR. The NOR gate NOR may be the same in configuration as the NOR gate NOR1 shown in FIG. 4. The configuration of the pre-emphasis pull-up pre-driver EPPU' may differ from that of the pre-emphasis pull-down pre-driver EPPD' in terms of the signals that are input and the signals that are output. Accordingly, differences in the inputs and/or outputs of the pre-emphasis pull-down pre-driver EPPD' from the pre-emphasis pull-up pre-driver EPPU' are illustrated in parentheses in FIG. 9.

The operation of the inverted NOR gate NOR1' shown in FIG. 9 will hereinafter be described.

The inverters I8, I9, and I10 may invert the pre-emphasis enable signal EMPEN, pre-emphasis pull-up control code bit EPUC1 (or pre-emphasis pull-down control code bit EPDC1), and first pulse signal P (or second pulse signal PB) of "high" levels to generate a pre-emphasis enable signal empenb', a pre-emphasis pull-up control code bit epucd1' (or pre-emphasis pull-down control code bit epdcd1'), and a first pulse signal pb' (or second pulse signal pbb') of "low" levels, respectively.

In the case where the pre-emphasis enable signal empenb' and the pre-emphasis pull-up control code bit epucd1' (or pre-emphasis pull-down control code bit epdcd1') are both "low" in level, the NOR gate NOR may generate the pre-emphasis pull-up control signal rdcu21 (or pre-emphasis pull-down control signal rdcd21) of a "high" level (e.g., first supply voltage VP1 or second supply voltage VP2) when the first pulse signal pb' (or second pulse signal pbb') is "low" in level, and may generate the pre-emphasis pull-up control signal rdcu21 (or pre-emphasis pull-down control signal rdcd21) of a "low" level (e.g., ground voltage) when the first pulse signal pb' (or second pulse signal pbb') is "high" in level.

Each of the other inverted NOR gates NOR2' to NORi' may perform the same operation as that of the above inverted NOR gate NOR1'.

In the above example embodiments, each of the pre-emphasis pull-up driver EPU and the pre-emphasis pull-down driver EPD may be configured with one NMOS pull-up transistor ENU1 and one NMOS pull-down transistor END1. In this case, the pre-emphasis pull-up control code EPUC and the pre-emphasis pull-down control code EPDC which are applied respectively to the pre-emphasis pull-up pre-driver EPPU' and the pre-emphasis pull-down pre-driver EPPD' may not be used.

Figure 10:
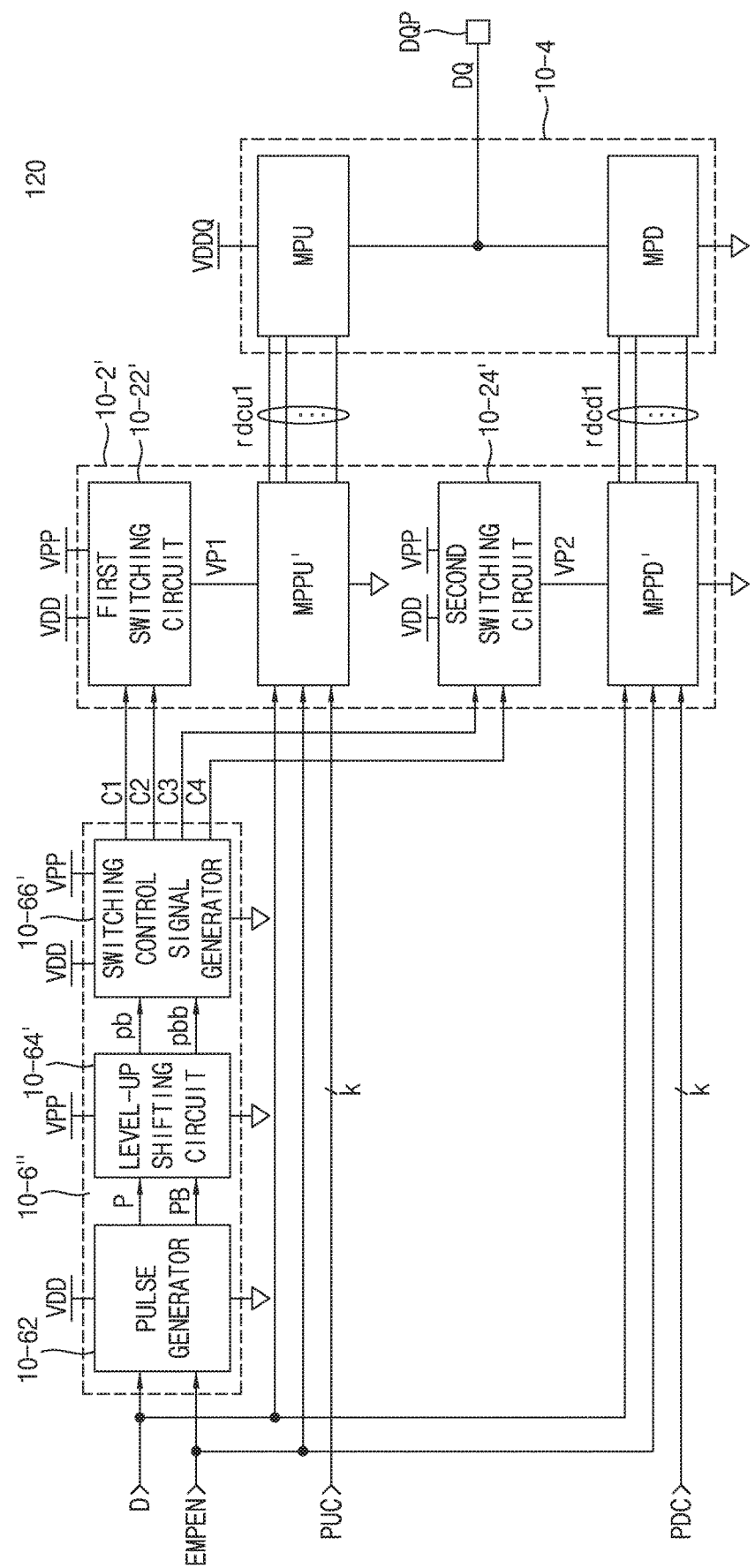
FIG. 10 is a schematic diagram showing a configuration of an output driver according to example embodiments of the inventive concepts.

FIG. 10 is a schematic diagram showing a configuration of an output driver 120 according to example embodiments of the inventive concepts. The output driver 120 shown in FIG. 10 may include a pre-emphasis controller 10-6", a main pre-driver 10-2', and a main driver 10-4. The pre-emphasis controller 10-6" may be the same in configuration as the pre-emphasis controller 10-6' shown in FIG. 6. The main pre-driver 10-2' may include a first switching circuit 10-22', a main pull-up pre-driver MPPU', a second switching circuit 10-24', and a main pull-down pre-driver MPPD'. The main driver 10-4 may be the same in configuration as the main driver 10-4 shown in FIG. 1.

The function of each of the blocks shown in FIG. 10 will hereinafter be described.

A pulse generator 10-62, a level-up shifting circuit 10-64', a switching control signal generator 10-66', the first switching circuit 10-22', and the second switching circuit 10-24' may perform the same operations as those of the pulse generator 10-62, the level-up shifting circuit 10-64', the switching control signal generator 10-66', the first switching circuit 10-82', and the second switching circuit 10-84' shown in FIG. 6, respectively.

The main pull-up pre-driver MPPU' may receive the first supply voltage VP1, and generate the k main pull-up control signals rdcu1 in response to the data D, the pre-emphasis enable signal EMPEN, and the k-bit main pull-up control code PUC.

The main pull-down pre-driver MPPD' may receive the second supply voltage VP2, and generate the k main pull-down control signals rdcd1 in response to the data D, the pre-emphasis enable signal EMPEN, and the k-bit main pull-down control code PDC.

Figure 11:
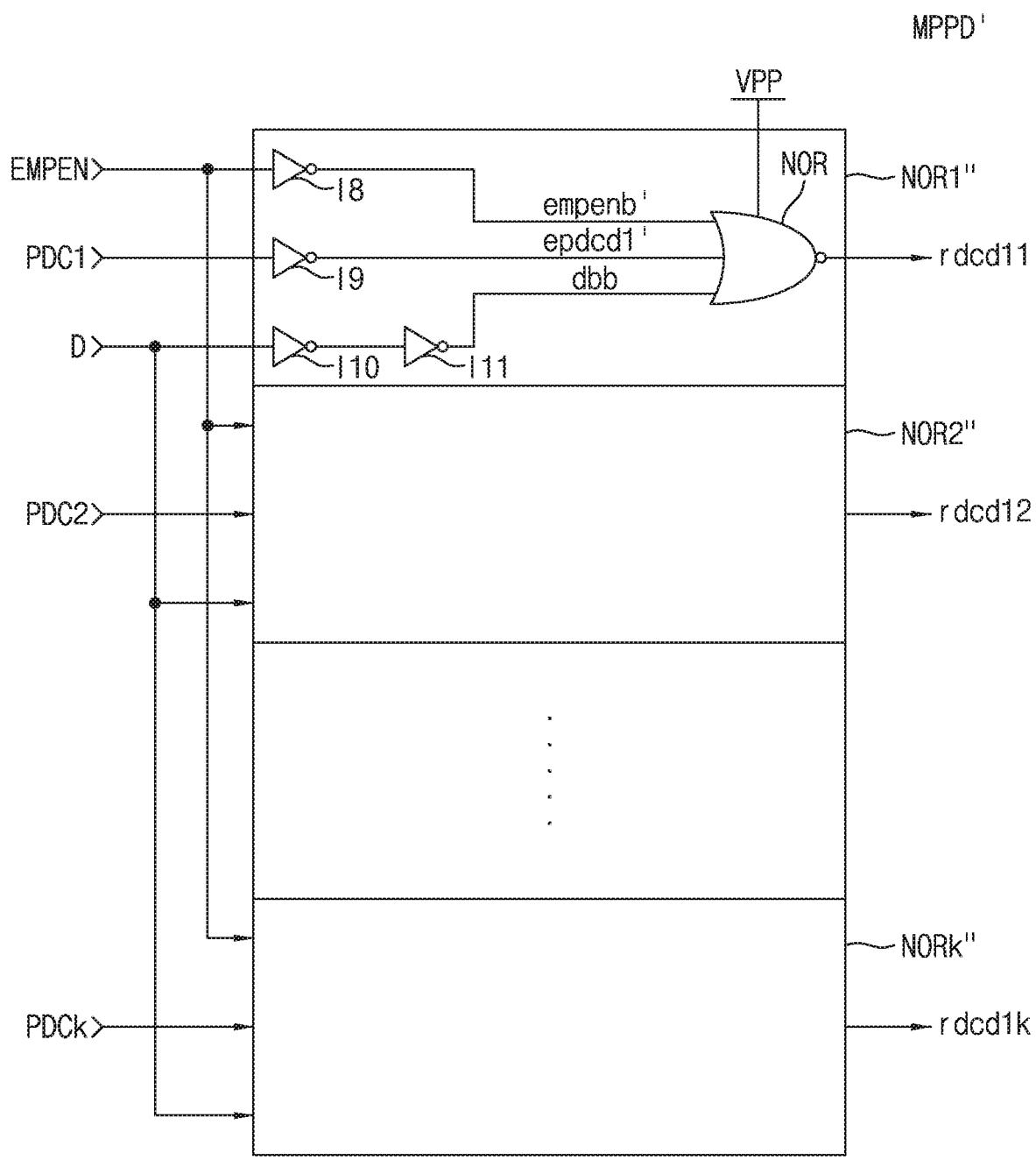
FIG. 11 is a schematic diagram showing a configuration of a main pull-down pre-driver according to example embodiments of the inventive concepts.

FIG. 11 is schematic diagram showing a configuration of a main pull-down pre-driver MPPD' according to example embodiments of the inventive concepts. As shown in FIG. 11, the main pull-down pre-driver MPPD' may include k inverted NOR gates NOR1" to NORk". Each of the k inverted NOR gates NOR1" to NORk" may include an inverter I11 in addition to the inverted NOR gate NOR1' shown in FIG. 9.

The operation of the inverted NOR gate NOR1" shown in FIG. 11 will hereinafter be described.

The inverters I8 and I9 may invert the pre-emphasis enable signal EMPEN and the main pull-down control code bit PDC1 of "high" levels to generate a pre-emphasis enable signal empenb' and a main pull-down control code bit epdc1' of "low" levels, respectively. The inverters I10 and I11 may receive the data D of a "high" level and generate data dbb of a "high" level.

In the case where the pre-emphasis enable signal empenb' and the main pull-down control code bit epdc1' are both "low" in level, the NOR gate NOR may generate the main pull-down control signal rdcd11 of a "high" level (e.g., high supply voltage VPP) when the data dbb is "low" in level, and may generate the main pull-down control signal rdcd11 of a "low" level (e.g., ground voltage) when the data dbb is "high" in level.

Each of the other inverted NOR gates NOR2" to NORk" may perform the same operation as that of the above inverted NOR gate NOR1".

Although not shown, the main pull-up pre-driver MPPU' may include the k inverted NOR gates NOR1" to NORk" instead of the i inverted NOR gates NOR1' to NORi' shown in FIG. 9. The main pull-up pre-driver MPPU' may be the same in configuration as the pre-emphasis pull-up pre-driver EPPU' shown in FIG. 9, with the exception that the data D is received instead of the first pulse signal P and the main pull-up control code PUC is received instead of the pre-emphasis pull-up control code EPUC.

Figure 12:
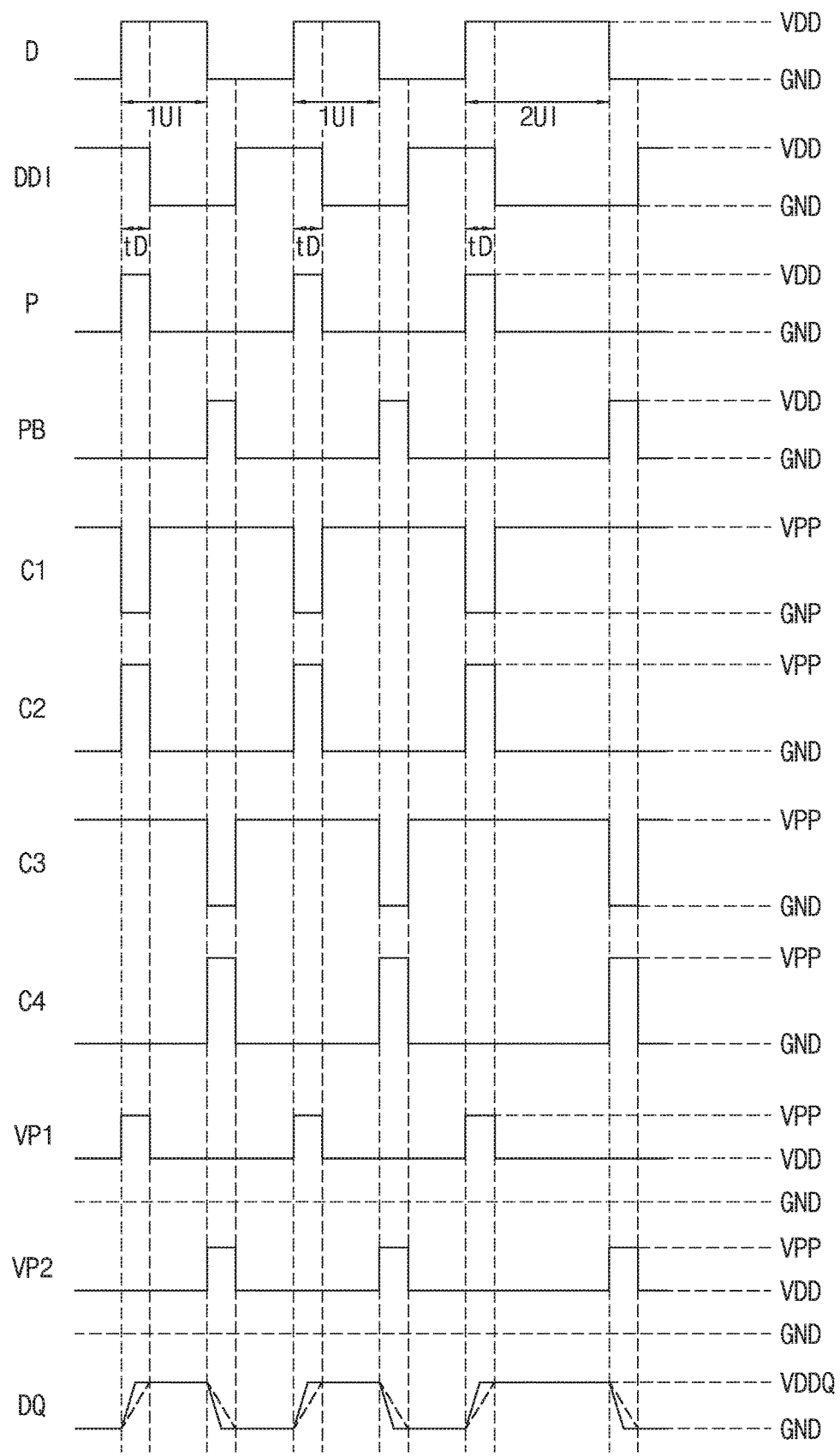
FIG. 12 is a timing diagram illustrating an operation of an output driver according to example embodiments of the inventive concepts.

FIG. 12 is a timing diagram illustrating an operation of an output driver according to example embodiments of the inventive concepts, more particularly, an operation based on the data D when the pre-emphasis enable signal EMPEN of a "high" level and the k-bit main pull-up control code PUC, i-bit pre-emphasis pull-up control code EPUC (or k-bit main pull-up control code PUC), k-bit main pull-down control code PDC, and i-bit pre-emphasis pull-down control code EPDC (or k-bit main pull-down control code PDC) of "high" levels are applied.

Referring to FIG. 12 and FIGS. 6 to 11, the data D, the inverted delay data DDI, the first pulse signal P, and the second pulse signal PB may be generated in the same manner as in the timing diagram of FIG. 5.

Although not shown, the level-up shifting circuit 10-64' may up the levels of the first pulse signal P and second pulse signal PB to generate the first level-up pulse signal pb and the second level-up pulse signal pbb.

The fifth inverter I5 may invert the first level-up pulse signal pb (or second level-up pulse signal pbb) to generate the first control signal C1 (or third control signal C3). The first control signal C1 (or third control signal C3) may swing between the high supply voltage VPP and the ground voltage.

The sixth and seventh inverters I6 and I7 may receive the first level-up pulse signal pb (or second level-up pulse signal pbb) and generate the second control signal C2 (or fourth control signal C4). The second control signal C2 (or fourth control signal C4) may swing between the high supply voltage VPP and the ground voltage.

The seventh PMOS transistor P7 of each of the first switching circuit 10-82' or 10-22' and second switching circuit 10-84' or 10-24' may generate the high supply voltage VPP as the first supply voltage VP1 (or second supply voltage VP2) in response to the first control signal C1 (or third control signal C3) of the ground voltage, and the sixth PMOS transistor P6 thereof may generate the internal supply voltage VDD as the first supply voltage VP1 (or second supply voltage VP2) in response to the second control signal C2 (or fourth control signal C4) of the ground voltage. As a result, the high supply voltage VPP may be generated as the first supply voltage VP1 or the second supply voltage VP2 for the predetermined time tD upon the rising transition or falling transition of the data D, and the internal supply voltage VDD may be generated as the first supply voltage VP1 or the second supply voltage VP2 for the remaining period.

Data DQ indicated by a solid line represents data in the case where the pre-emphasis enable signal EMPEN of the "high" level is applied and the pre-emphasis driver 10-10 or the main driver 10-4 thus performs the pre-emphasis operation, and data DQ indicated by a dotted line represents data in the case where the pre-emphasis enable signal EMPEN of the "low" level is applied and the pre-emphasis driver 10-10 or the main driver 10-4 is thus not operated. As compared with the data DQ indicated by the dotted line, the data DQ indicated by the solid line may rapidly rise to the "high" level upon rising transition and may rapidly fall to the "low" level upon falling transition.

According to the embodiments shown in FIGS. 1 to 12, for the period in which the pre-emphasis operation is performed (namely, the activation period of the first pulse signal P or second pulse signal PB), the high supply voltage VPP may be applied to the gates of the corresponding pull-up NMOS transistors or pull-down NMOS transistors of the pre-emphasis pre-driver 10-8' or main pre-driver 10-2', so as to increase voltage differences between the gates and sources of the corresponding pull-up NMOS transistors or pull-down NMOS transistors, thereby increasing driving capability of the pre-emphasis pre-driver 10-8' or main pre-driver 10-2'. Therefore, it may be possible to rapidly make the rising transition and falling transition of the output data DQ.

Figure 13:
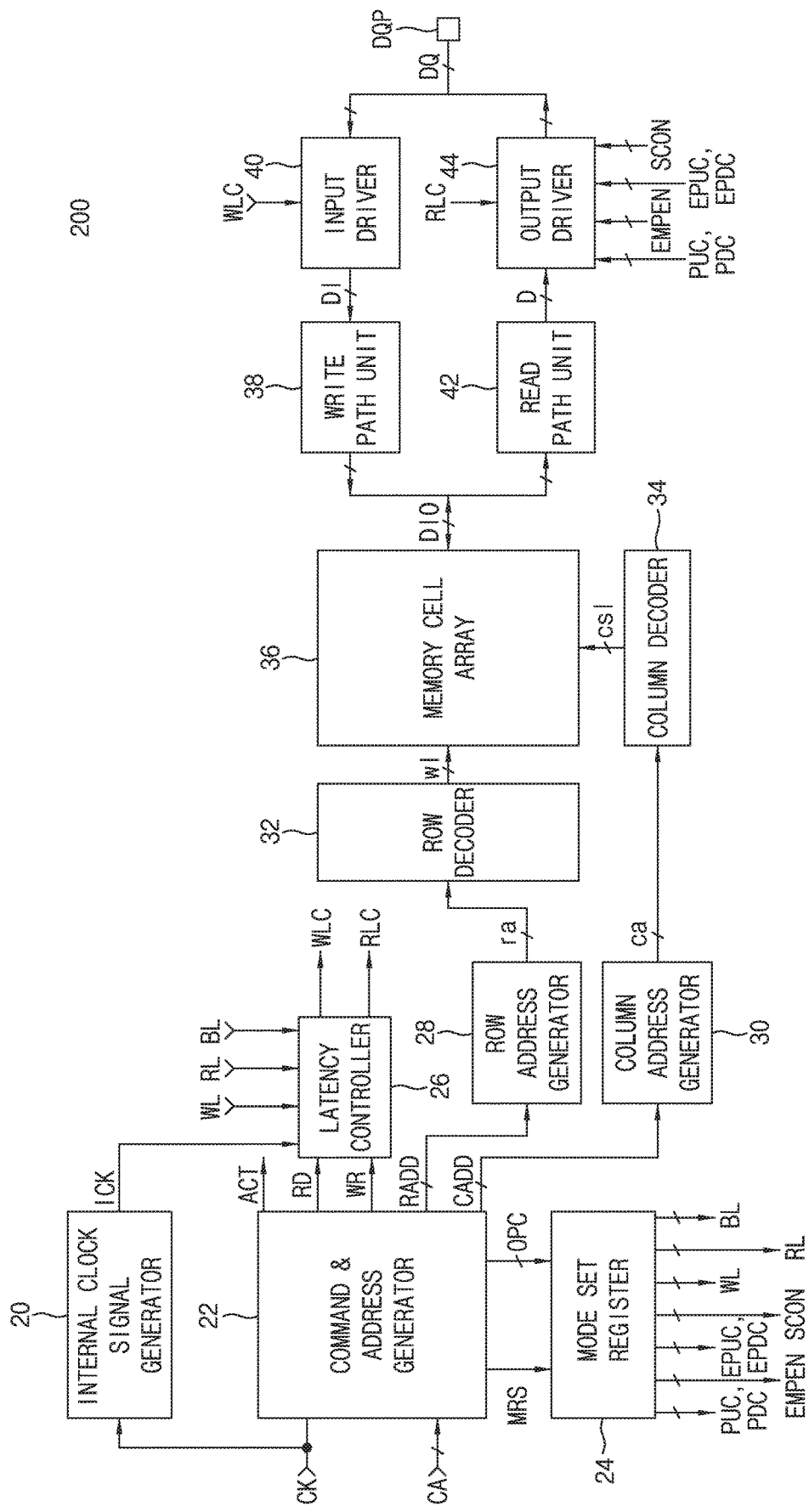
FIG. 13 is a schematic block diagram showing the configuration of a semiconductor memory device according to example embodiments of the inventive concepts.

FIG. 13 is a block diagram showing the configuration of a semiconductor memory device 200 according to example embodiments of the inventive concepts. As shown in FIG. 13, the semiconductor memory device 200 may include an internal clock signal generator 20, a command & address generator 22, a mode set register 24, a latency controller 26, a row address generator 28, a column address generator 30, a row decoder 32, a column decoder 34, a memory cell array 36, a write path unit 38, an input driver 40, a read path unit 42, and an output driver 44.

The function of each of the blocks shown in FIG. 13 will hereinafter be described.

The internal clock signal generator 20 may receive an external clock signal CK and generate an internal clock signal ICK. The internal clock signal generator 20 may be a delay locked loop circuit.

The command & address generator 22 may receive an external command & address CA in response to the external clock signal CK, decode a command signal included in the command & address CA to generate a command, for example, a mode set command MRS, an active command ACT, a write command WR, or a read command RD, and generate an address signal included in the command & address CA as a mode set code OPC, a row address signal RADD, or a column address signal CADD. For example, the command & address generator 22 may generate the address signal included in the command & address CA as the mode set code OPC when the command signal included in the command & address CA is the mode set command MRS, as the row address signal RADD when the same is the active command ACT, and as the column address signal CADD when the same is the write command WR or read command RD.

The mode set register 24 may receive the mode set code OPC in response to the mode set command MRS and set main pull-up and pull-down control codes PUC and PDC, a pre-emphasis enable signal EMPEN, pre-emphasis pull-up and pull-down control codes EPUC and EPDC, a selection signal SCON, a write latency WL, a read latency RL, and a burst length BL. In embodiments in which the pre-emphasis pull-up driver EPU and the pre-emphasis pull-down driver EPD in FIGS. 1 and 6 are configured with one NMOS pull-up transistor ENU1 and one NMOS pull-down transistor END1, respectively, the pre-emphasis pull-up control code EPUC and the pre-emphasis pull-down control code EPDC may not be set.

The latency controller 26 may generate a write control signal WLC in response to the write command WR and may generate a read control signal RLC in response to the read command RD. When the write command WR is generated, the latency controller 26 may generate, based on the internal clock signal ICK, the write control signal WLC that is activated using the value of the write latency WL and deactivated using the value of the write latency WL and the value of the burst length BL. That is, the latency controller 26 may generate the write control signal WLC that is activated for a period in which data DQ is applied through a data terminal DQP. In addition, when the read command RD is generated, the latency controller 26 may generate, based on the internal clock signal ICK, the read control signal RLC that is activated using the value of the read latency RL and deactivated using the value of the read latency RL and the value of the burst length BL. That is, the latency controller 26 may generate the read control signal RLC that is activated for a period in which data DQ is output through the data terminal DQP.

The row address generator 28 may generate the row address signal RADD as an internal row address ra.

The column address generator 30 may generate the column address signal CADD as an internal column address ca.

The row decoder 32 may decode the internal row address ra to generate word line selection signals wl.

The column decoder 34 may decode the internal column address ca to generate column selection signals csl.

The memory cell array 36 may input/output data DIO to/from memory cells selected among a plurality of memory cells in response to the word line selection signals wl and the column selection signals csl.

The write path unit 38 may receive data DI and generate the data DIO. The write path unit 38 may sequentially receive the data DI by the number corresponding to the value of the burst length BL and generate the data DIO in parallel.

The read path unit 42 may receive the data DIO and generate data D. The read path unit 42 may receive the data DIO in parallel and sequentially generate the data D by the number corresponding to the value of the burst length BL.

The input driver 40 may be enabled in response to the write control signal WLC to receive input data DQ applied through the data terminal DQP and generate the data DI.

The output driver 44 may be enabled in response to the read control signal RLC to receive the data D and output output data DQ through the data terminal DQP. The output driver 44 may be any one of the output drivers 100, 110, and 120 of the embodiments described with reference to FIGS. 1 to 12.

The output driver 44 of the semiconductor memory device shown in FIG. 13 may rapidly make a rising transition and a falling transition of the output data DQ by performing a pre-emphasis operation upon a rising transition and a falling transition of the data D.

Although the output driver has been shown in the above example embodiments as being configured to perform the pre-emphasis operation upon both the rising transition and falling transition, the output driver may be configured to perform the pre-emphasis operation upon at least one of the rising transition or the falling transition.

As is apparent from the above description, in an output driver according to example embodiments of the inventive concepts, a high supply voltage may be applied to the gate of a pull-up and/or pull-down NMOS transistor of a pre-emphasis pre-driver (or main pre-driver) upon a "high" to "low" level transition and/or "low" to "high" level transition of data, so as to increase a voltage between the gate and source of the NMOS transistor, thereby pre-emphasizing output data.

Therefore, in an output driver and a semiconductor memory device having the same according to example embodiments of the inventive concepts, output data may more rapidly transition.

While the inventive concepts have been particularly shown and described with reference to example embodiments thereof, it will be apparent to those skilled in the art that various changes in form and detail may be made without departing from the scope of the inventive concepts. The above example embodiments are therefore to be construed in all aspects as illustrative and not restrictive.

What is claimed is:

1. An output driver comprising:
a main output driver configured to receive data of an internal supply voltage to generate output data of an output supply voltage lower than the internal supply voltage and to receive the data of a ground voltage to generate the output data of the ground voltage;
a pre-emphasis controller configured to detect a transition of the data from the ground voltage to the internal supply voltage to generate a first pulse signal that is activated for a predetermined time, and to receive a pre-emphasis enable signal and generate a level-up pre-emphasis enable signal and a first level-up pulse signal of the ground voltage in response to the received pre-emphasis enable signal and the first pulse signal;
a pre-emphasis pre-driver configured to generate one or more pre-emphasis pull-up control signals of a high supply voltage higher than the internal supply voltage using the level-up pre-emphasis enable signal and the first level-up pulse signal of the ground voltage; and
a pre-emphasis driver configured to pre-emphasize the output data in response to the one or more pre-emphasis pull-up control signals of the high supply voltage based on the output data transitioning from the ground voltage to the output supply voltage lower than the internal supply voltage.

2. The output driver according to claim 1, wherein the pre-emphasis controller is further configured to detect a transition of the data from the internal supply voltage to the ground voltage to further generate a second pulse signal that is activated for the predetermined time, and is further configured to receive the pre-emphasis enable signal and further generate a second level-up pulse signal of the ground voltage in response to the received pre-emphasis enable signal and the second pulse signal, wherein the pre-emphasis pre-driver is further configured to generate one or more pre-emphasis pull-down control signals of the high supply voltage using the level-up pre-emphasis enable signal and second level-up pulse signal of the ground voltage, and wherein the pre-emphasis driver is further configured to pre-emphasize the output data in response to the one or more pre-emphasis pull-down control signals in response to the output data transitioning from the internal supply voltage to the ground voltage.

3. The output driver according to claim 2, wherein the main output driver comprises:

a main pull-up pre-driver configured to generate a predetermined number of main pull-up control signals of the internal supply voltage in response to the data of the internal supply voltage and a main pull-up control code of the ground voltage;

a main pull-down pre-driver configured to generate a predetermined number of main pull-down control signals of the internal supply voltage in response to the data of the ground voltage and a main pull-down control code of the ground voltage;

a main pull-up driver comprising a predetermined number of main pull-up NMOS transistors connected in parallel between the output supply voltage and a data terminal and configured to turn on in response to the predetermined number of main pull-up control signals of the internal supply voltage; and a main pull-down driver comprising a predetermined number of main pull-down NMOS transistors connected in parallel between the data terminal and the ground voltage and configured to turn on in response to the predetermined number of main pull-down control signals of the internal supply voltage, and wherein the pre-emphasis driver comprises:

a pre-emphasis pull-up driver comprising one or more pre-emphasis pull-up NMOS transistors connected between the output supply voltage and the data terminal and configured to turn on in response to the one or more pre-emphasis pull-up control signals of the high supply voltage; and a pre-emphasis pull-down driver comprising one or more pre-emphasis pull-down NMOS transistors connected between the data terminal and the ground voltage and configured to turn on in response to the one or more pre-emphasis pull-down control signals of the high supply voltage.

4. The output driver according to claim 3, wherein the predetermined number of main pull-up NMOS transistors are the same or different in size, the predetermined number of main pull-down NMOS transistors are the same or different in size, the one or more pre-emphasis pull-up NMOS transistors are the same or different in size, and the one or more pre-emphasis pull-down NMOS transistors are the same or different in size.

5. The output driver according to claim 2, wherein the pre-emphasis controller comprises:

a pulse generator configured to operate in response to the pre-emphasis enable signal to delay and invert the data by the predetermined time to generate inverted delay data, and to generate the first pulse signal and the second pulse signal using the data and the inverted delay data; and a level-up shifting circuit configured to raise levels of the pre-emphasis enable signal, first pulse signal, and second pulse signal to generate the level-up pre-emphasis enable signal, the first level-up pulse signal, and the second level-up pulse signal of the high supply voltage.

6. The output driver according to claim 5, wherein the pulse generator comprises:

an inverted delay circuit configured to operate in response to the pre-emphasis enable signal to delay and invert the data by the predetermined time to generate the inverted delay data;

an AND gate configured to perform a logical AND operation on the data and the inverted delay data to generate the first pulse signal; and a NOR gate configured to perform a logical NOR operation on the data and the inverted delay data to generate the second pulse signal.

7. The output driver according to claim 6, wherein the inverted delay circuit is further configured to vary the predetermined time by varying a delay time of the inverted delay data in response to a selection signal, wherein the predetermined time is smaller than a duration in which the data is at a logic high level.

8. An output driver comprising:

a pre-emphasis controller configured to detect a transition of data from a ground voltage to an internal supply voltage to generate a first pulse signal that is activated for a predetermined time, and to generate a first control signal and a second control signal using the first pulse signal;

a first switching circuit configured to supply a high supply voltage higher than the internal supply voltage as a first supply voltage in response to the first control signal and supply the internal supply voltage as the first supply voltage in response to the second control signal;

a pre-emphasis pre-driver or a main pre-driver configured to generate one or more pre-emphasis pull-up control signals of the first supply voltage using the first pulse signal and a pre-emphasis enable signal of the internal supply voltage or generate a predetermined number of main pull-up control signals of the first supply voltage using the first pulse signal, the pre-emphasis enable signal, and a main pull-up control code of the internal supply voltage; and a pre-emphasis driver or a main driver configured to drive output data in response to the one or more pre-emphasis pull-up control signals or main pull-up control signals of the first supply voltage and pre-emphasize the output data when the output data transitions from the ground voltage to an output supply voltage lower than the internal supply voltage.

9. The output driver according to claim 8, wherein the pre-emphasis controller is further configured to detect a transition of the data from the internal supply voltage to the ground voltage to further generate a second pulse signal that is activated for the predetermined time, and to further generate a third control signal and a fourth control signal using the second pulse signal, wherein the output driver further comprises a second switching circuit configured to supply the high supply voltage as a second supply voltage in response to the third control signal and supply the internal supply voltage as the second supply voltage in response to the fourth control signal, wherein the pre-emphasis pre-driver or the main pre-driver further generates one or more pre-emphasis pull-down control signals of the second supply voltage using the second pulse signal and the pre-emphasis enable signal of the internal supply voltage or further generates a predetermined number of main pull-down control signals of the second supply voltage using the second pulse signal, the pre-emphasis enable signal and a main pull-down control code of the internal supply voltage, and wherein the pre-emphasis driver or the main driver is further configured to drive the output data in response to the one or more pre-emphasis pull-down control signals or the predetermined number of main pull-down control signals of the second supply voltage and to further pre-emphasize the output data based on the output data transitioning from the internal supply voltage to the ground voltage.

10. The output driver according to claim 9, wherein the main pre-driver comprises:
a main pull-up pre-driver configured to generate the predetermined number of main pull-up control signals of the internal supply voltage in response to the data of the internal supply voltage and the pre-emphasis enable signal and the main pull-up control code of the ground voltage; and
a main pull-down pre-driver configured to generate the predetermined number of main pull-down control signals of the internal supply voltage in response to the data of the ground voltage and the pre-emphasis enable signal and the main pull-down control code of the ground voltage, and
wherein the main driver comprises:
a main pull-up driver comprising a predetermined number of main pull-up NMOS transistors connected in parallel between the output supply voltage and a data terminal that are configured to be turned on in response to the predetermined number of main pull-up control signals of the first supply voltage; and
a main pull-down driver comprising a predetermined number of main pull-down NMOS transistors connected in parallel between the data terminal and the ground voltage and configured to be turned on in response to the predetermined number of main pull-down control signals of the internal supply voltage.

11. The output driver according to claim 9, wherein the main pre-driver comprises:
a main pull-up pre-driver configured to generate the predetermined number of main pull-up control signals of the internal supply voltage in response to the data of the internal supply voltage and the main pull-up control code of the ground voltage; and
a main pull-down pre-driver configured to generate the predetermined number of main pull-down control signals of the internal supply voltage in response to the data of the ground voltage and the main pull-down control code of the ground voltage,
wherein the main driver comprises:
a main pull-up driver comprising a predetermined number of main pull-up NMOS transistors connected in parallel between the output supply voltage and a data terminal and configured to be turned on in response to the predetermined number of main pull-up control signals of the first supply voltage; and
a main pull-down driver comprising a predetermined number of main pull-down NMOS transistors connected in parallel between the data terminal and the ground voltage and configured to be turned on in response to the predetermined number of main pull-down control signals of the internal supply voltage, and
wherein the pre-emphasis driver comprises:
a pre-emphasis pull-up driver comprising one or more pre-emphasis pull-up NMOS transistors connected between the output supply voltage and the data terminal and configured to be turned on in response to the one or more pre-emphasis pull-up control signals; and
a pre-emphasis pull-down driver comprising one or more pre-emphasis pull-down NMOS transistors connected between the data terminal and the ground voltage and configured to be turned on in response to the one or more pre-emphasis pull-down control signals.

12. The output driver according to claim 11, wherein the predetermined number of main pull-up NMOS transistors are the same or different in size, the predetermined number of main pull-down NMOS transistors are the same or different in size, the one or more pre-emphasis pull-up NMOS transistors are the same or different in size, and the one or more pre-emphasis pull-down NMOS transistors are the same or different in size.

13. The output driver according to claim 9, wherein the pre-emphasis controller comprises:
a pulse generator configured to operate in response to the pre-emphasis enable signal to delay and invert the data by the predetermined time to generate inverted delay data, and to generate the first pulse signal and the second pulse signal using the data and the inverted delay data;
a level-up shifting circuit configured to raise levels of the first pulse signal and second pulse signal to generate a first level-up pulse signal and a second level-up pulse signal of the high supply voltage; and
a switching control signal generator configured to receive the first level-up pulse signal and generate the first control signal and the second control signal, and to receive the second level-up pulse signal and generate the third control signal and the fourth control signal.

14. The output driver according to claim 13, wherein the pulse generator varies the predetermined time by varying a delay time of the inverted delay data in response to a selection signal,
wherein the predetermined time is smaller than a duration in which the data is at a logic high level.

15. A semiconductor memory device comprising:
a command & address generator configured to receive a command & address, decode a command signal included in the command & address to generate a mode set command, an active command, or a read command, and generate an address signal included in the command & address as a mode set code in response to the command signal included in the command & address being the mode set command, as a row address signal in response to the command signal being the active command, and as a column address signal in response to the command signal being the read command;
a mode set register configured to receive the mode set code in response to the mode set command and set a main pull-up control code and a pre-emphasis enable signal;
a row decoder configured to generate word line selection signals using the row address signal;
a column decoder configured to generate column selection signals using the column address signal;
a memory cell array configured to output data from memory cells selected from among a plurality of memory cells in response to the word line selection signals and the column selection signals;
a read path unit configured to output the data output from the memory cell array; and a plurality of output drivers configured to drive the data output from the read path unit to output output data to a plurality of data terminals, wherein each of the output drivers comprises:

a main output driver configured to generate the output data that transitions between an output supply voltage lower than an internal supply voltage and a ground voltage in response to the data and the main pull-up control code;

a pre-emphasis controller configured to detect a transition of the data from the ground voltage to the internal supply voltage to generate a first pulse signal, and to receive the pre-emphasis enable signal and generate a level-up pre-emphasis enable signal and a first level-up pulse signal of the ground voltage in response to the received pre-emphasis enable signal and the first pulse signal;

a pre-emphasis pre-driver configured to generate one or more pre-emphasis pull-up control signals of a high supply voltage higher than the internal supply voltage using the level-up pre-emphasis enable signal and first level-up pulse signal of the ground voltage; and a pre-emphasis driver configured to vary a transition time of the output data in response to the one or more pre-emphasis pull-up control signals of the high supply voltage based on the output data transitioning between the ground voltage to the output supply voltage lower than the internal supply voltage.

16. The semiconductor memory device according to claim 15, wherein the pre-emphasis controller is further configured to detect a transition of the data from the internal supply voltage to the ground voltage to further generate a second pulse signal that is activated for a predetermined time, and is further configured to receive the pre-emphasis enable signal and further generate a second level-up pulse signal of the ground voltage in response to the received pre-emphasis enable signal and the second pulse signal, wherein the pre-emphasis pre-driver is further configured to generate one or more pre-emphasis pull-down control signals of the high supply voltage using the level-up pre-emphasis enable signal and second level-up pulse signal of the ground voltage, and wherein the pre-emphasis driver is further configured to vary the transition time of the output data in response to the one or more pre-emphasis pull-down control signals in response to the output data transitioning from the internal supply voltage to the ground voltage.

17. The semiconductor memory device according to claim 16, wherein the mode set register is configured to receive the mode set code in response to the mode set command and to further set a main pull-down control code, wherein the main output driver comprises:

a main pull-up pre-driver configured to generate a predetermined number of main pull-up control signals of the internal supply voltage in response to the data of the internal supply voltage and the main pull-up control code of the ground voltage;

a main pull-down pre-driver configured to generate a predetermined number of main pull-down control signals of the internal supply voltage in response to the data of the ground voltage and the main pull-down control code of the ground voltage;

a main pull-up driver comprising a predetermined number of main pull-up NMOS transistors connected in parallel between the output supply voltage and a corresponding one of the data terminals and configured to turn on in response to the predetermined number of main pull-up control signals of the internal supply voltage; and a main pull-down driver comprising a predetermined number of main pull-down NMOS transistors connected in parallel between the corresponding data terminal and the ground voltage and configured to turn on in response to the predetermined number of main pull-down control signals of the internal supply voltage, and wherein the pre-emphasis driver comprises:

a pre-emphasis pull-up driver comprising one or more pre-emphasis pull-up NMOS transistors connected between the output supply voltage and the corresponding data terminal and configured to turn on in response to the one or more pre-emphasis pull-up control signals of the high supply voltage; and a pre-emphasis pull-down driver comprising one or more pre-emphasis pull-down NMOS transistors connected between the corresponding data terminal and the ground voltage and configured to turn on in response to the one or more pre-emphasis pull-down control signals of the high supply voltage.

18. The semiconductor memory device according to claim 17, wherein the predetermined number of main pull-up NMOS transistors are the same or different in size, the predetermined number of main pull-down NMOS transistors are the same or different in size, the one or more pre-emphasis pull-up NMOS transistors are the same or different in size, and the one or more pre-emphasis pull-down NMOS transistors are the same or different in size.

19. The semiconductor memory device according to claim 16, wherein the pre-emphasis controller comprises:

a pulse generator configured to operate in response to the pre-emphasis enable signal to delay and invert the data by the predetermined time to generate inverted delay data, and to generate the first pulse signal and the second pulse signal using the data and the inverted delay data; and a level-up shifting circuit configured to raise levels of the pre-emphasis enable signal, the first pulse signal, and the second pulse signal to generate the level-up pre-emphasis enable signal, the first level-up pulse signal, and the second level-up pulse signal of the high supply voltage.

20. The semiconductor memory device according to claim 19, wherein the mode set register is further configured to receive the mode set code in response to the mode set command and to further set a selection signal, and wherein the pulse generator is further configured to vary the predetermined time by varying a delay time of the inverted delay data in response to the selection signal, wherein the predetermined time is smaller than a duration in which the data is at a logic high level.

* * * * *